(12) United States Patent
Lim et al.

(10) Patent No.: US 11,189,633 B2
(45) Date of Patent: Nov. 30, 2021

(54) SEMICONDUCTOR DEVICE AND APPARATUS OF MANUFACTURING THE SAME

(71) Applicant: Samsung Electronics Co., Ltd., Suwon-si (KR)

(72) Inventors: Taisoo Lim, Suwon-si (KR); Kyungwook Park, Suwon-si (KR); Keun Lee, Suwon-si (KR); Hauk Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/700,801

(22) Filed: Dec. 2, 2019

(65) Prior Publication Data

US 2020/0303409 A1   Sep. 24, 2020

(30) Foreign Application Priority Data

Mar. 21, 2019  (KR) .................. 10-2019-0032477
Jul. 16, 2019  (KR) .................. 10-2019-0085709

(51) Int. Cl.
*H01L 27/11582*   (2017.01)
*H01L 29/423*   (2006.01)
(Continued)

(52) U.S. Cl.
CPC ........ *H01L 27/11582* (2013.01); *C23C 16/06* (2013.01); *C23C 16/45525* (2013.01); *C23C 16/56* (2013.01); *H01L 21/28568* (2013.01); *H01L 21/32135* (2013.01); *H01L 21/67069* (2013.01); *H01L 27/11565* (2013.01); *H01L 27/11573* (2013.01); *H01L 29/40117* (2019.08); *H01L 29/4234* (2013.01); (Continued)

(58) Field of Classification Search
CPC .......... H01L 29/4234; H01L 29/40117; H01L 29/7827; H01L 27/11582; H01L 27/11563; H01L 27/11568; H01L 27/1157; H01L 27/11578
See application file for complete search history.

(56) References Cited

U.S. PATENT DOCUMENTS 6,287,964 B1   9/2001  Cho
8,124,531 B2   2/2012  Chandrashekar et al.
(Continued)

*Primary Examiner* — Thanhha S Pham
(74) *Attorney, Agent, or Firm* — Muir Patent Law, PLLC

(57) ABSTRACT

A semiconductor device includes gate electrodes and interlayer insulating layers that are alternately stacked on a substrate, channel structures spaced apart from each other in a first direction and extending vertically through the gate electrodes and the interlayer insulating layers to the substrate, and a first separation region extending vertically through the gate electrodes and the interlayer insulating layers. Each gate electrode includes a first conductive layer and a second conductive layer, the first conductive layer disposed between the second conductive layer and each of two adjacent interlayer insulating layers. In a first region, between an outermost channel structure and the first separation region, of each gate electrode, the first conductive layer has a decreasing thickness toward the first separation region and the second conductive layer has an increasing thickness toward the first separation region.

20 Claims, 22 Drawing Sheets

(51) Int. Cl.
    *H01L 21/67*     (2006.01)
    *H01L 27/11565*     (2017.01)
    *H01L 27/11573*     (2017.01)
    *H01L 21/285*     (2006.01)
    *H01L 21/3213*     (2006.01)
    *C23C 16/56*     (2006.01)
    *C23C 16/455*     (2006.01)
    *C23C 16/06*     (2006.01)
    *H01L 21/28*     (2006.01)
    *H01L 21/02*     (2006.01)
    *H01L 29/66*     (2006.01)

(52) U.S. Cl.
    CPC .. *H01L 21/02636* (2013.01); *H01L 21/67167* (2013.01); *H01L 29/66545* (2013.01)

(56) References Cited

U.S. PATENT DOCUMENTS

| | | |
|---|---|---|
| 9,082,826 B2 | 7/2015 | Chandrashekar et al. |
| 9,240,347 B2 | 1/2016 | Chandrashekar et al. |
| 9,472,454 B2 | 10/2016 | Hotta et al. |
| 9,748,105 B2 | 8/2017 | Wu et al. |
| 2013/0302980 A1 | 11/2013 | Chandrashekar et al. |
| 2017/0062472 A1* | 3/2017 | Park .................. H01L 23/53257 |

* cited by examiner

SEMICONDUCTOR DEVICE AND APPARATUS OF MANUFACTURING THE SAME

CROSS-REFERENCE TO RELATED APPLICATION(S)

This application claims priority under 35 U.S.C. § 119 to Korean Patent Application Nos. 10-2019-0032477 filed on Mar. 21, 2019 and 10-2019-0085709 filed on Jul. 16, 2019 in the Korean Intellectual Property Office, the disclosures of which are incorporated by reference herein in their entirety.

BACKGROUND

The present inventive concept relates to a semiconductor device and an apparatus for manufacturing the same.

Semiconductor devices have been decreased in size and designed to store high-capacity data. Accordingly, it has been necessary to increase integration density of transistors included in the semiconductor devices. For higher integration density of the semiconductor devices, a vertical transistor structure, instead of a planar transistor structure, has been developed.

SUMMARY

Example embodiments provide a semiconductor device having increased reliability and an apparatus for manufacturing the semiconductor device.

According to an exemplary embodiment of the present inventive concept, a semiconductor device includes a plurality of gate electrodes and a plurality of interlayer insulating layers that are alternately stacked on a substrate, a plurality of channel structures spaced apart from each other in a first direction and extending vertically through the plurality of gate electrodes and the plurality of interlayer insulating layers to the substrate, and a first separation region extending vertically through the plurality of gate electrodes and the plurality of interlayer insulating layers. Each gate electrode includes a first conductive layer and a second conductive layer, the first conductive layer disposed between the second conductive layer and each of two adjacent interlayer insulating layers. In a first region, between an outermost channel structure and the first separation region, of each gate electrode, the first conductive layer has a decreasing thickness toward the first separation region and the second conductive layer has an increasing thickness toward the first separation region.

According to an exemplary embodiment of the present inventive concept, a semiconductor device includes a plurality of gate electrodes stacked vertically to be spaced apart from each other on a substrate, a plurality of channel structures extending vertically through the plurality of gate electrodes to the substrate, and a separation region extending through the plurality of gate electrodes. Each gate electrode includes a first conductive layer with a laterally recessed region adjacent to an outermost channel structure, and a second conductive layer disposed in the laterally recessed region. The laterally recessed region has a decreasing width toward the outermost channel structure.

According to an exemplary embodiment of the present inventive concept, an apparatus of manufacturing a semiconductor device includes a gas supply unit including a first deposition gas source, a second deposition gas source and an etching gas source, a process chamber connected to the gas supply unit, a gas injection unit disposed in the process chamber and including a gas supply passage connected to the first deposition gas source, the second deposition gas source and the etching gas source, and a control unit configured to control the gas supply unit such that a first deposition process in which a first process gas of the first deposition gas source and a second process gas of the second deposition gas source are alternately supplied to the process chamber via the gas injection unit, an etching process in which a third process gas of the etching gas source is supplied to the process chamber via the gas injection unit, and a second deposition process in which the first process gas of the first deposition gas source and the second process gas of the second deposition gas source are alternately supplied to the process chamber from via the gas injection unit are sequentially performed.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, the present inventive concept will be described with reference to the accompanying drawings.

Figure 1:
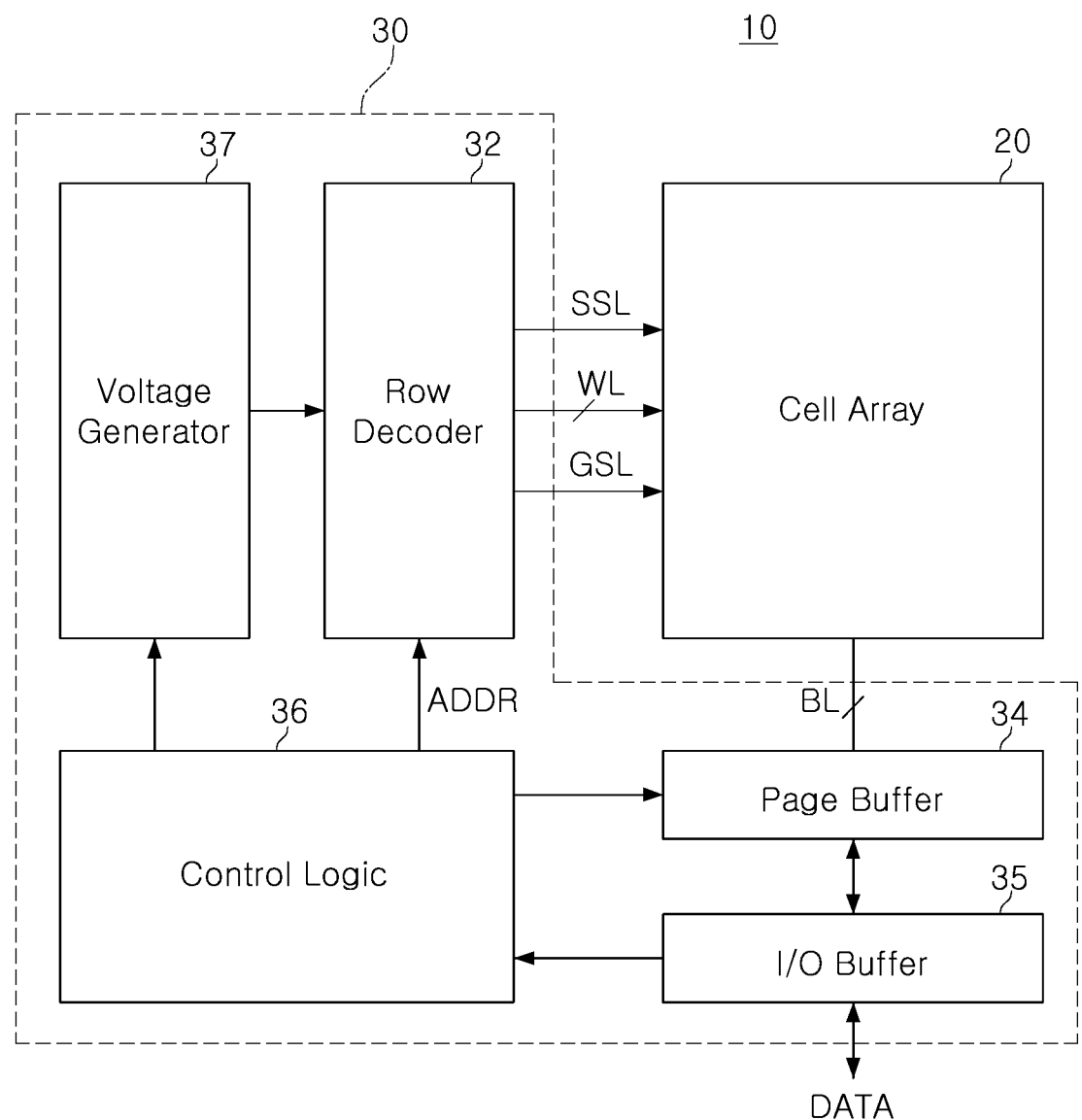
FIG. 1 is a schematic block diagram of a semiconductor device according to example embodiments.

FIG. 1 is a schematic block diagram of a semiconductor device according to example embodiments.

Referring to FIG. 1, a semiconductor device 10 may include a memory cell array 20 and a peripheral circuit 30. The peripheral circuit 30 may include a row decoder 32, a page buffer 34, an input and output buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, wordlines WL, and a ground select line GSL, and may be connected to the page buffer 34 through bitlines BL. In example embodiments, a plurality of memory cells arranged in the same row may be connected to the same wordline WL, and a plurality of memory cells arranged in the same column may be connected to the same bitline BL.

The row decoder 32 may decode an input address ADDR and may generate and transfer driving signals of the wordline WL. The row decoder 32 may provide a wordline voltage generated from the voltage generator 37 to a selected wordline WL and unselected wordlines WL in response to control of the control logic 36.

The page buffer 34 may be connected to the memory cell array 20 through the bitlines BL, and may read information stored in the memory cells. The page buffer 34 may temporarily store data to be stored in the memory cells or may sense data stored in the memory cells in accordance with an operational mode. The page buffer 34 may include a column decoder and a sense amplifier. The column decoder may selectively activate the bitlines BL of the memory cell array 20, and the sense amplifier may sense a voltage of a bitline BL selected by the column decoder and may read data stored in a selected memory cell during a reading operation.

The input and output buffer 35 may receive data DATA and may transfer the data to the page buffer 34 when a program operation, which may be referred to as a writing operation, is performed and, in a reading operation, the input and output buffer 35 may output the data DATA received from the page buffer 34 to an external entity. The input and output buffer 35 may transfer an input address or an input command to the control logic 36.

The control logic 36 may control operations of the row decoder 32 and the page buffer 34. The control logic 36 may receive a control signal and an external voltage transferred from an external entity, and may operate depending on the received control signal. The control logic 36 may control a reading operation, a writing operation, and/or an erasing operation in response to the control signals.

The voltage generator 37 may generate voltages required for internal operations, such as a program voltage, a reading operation voltage, an erasing operation voltage, and the like, for example, using an external voltage. The voltages, generated by the voltage generator 37, may be transferred to the memory cell array 20 through the row decoder 32.

Figure 2:
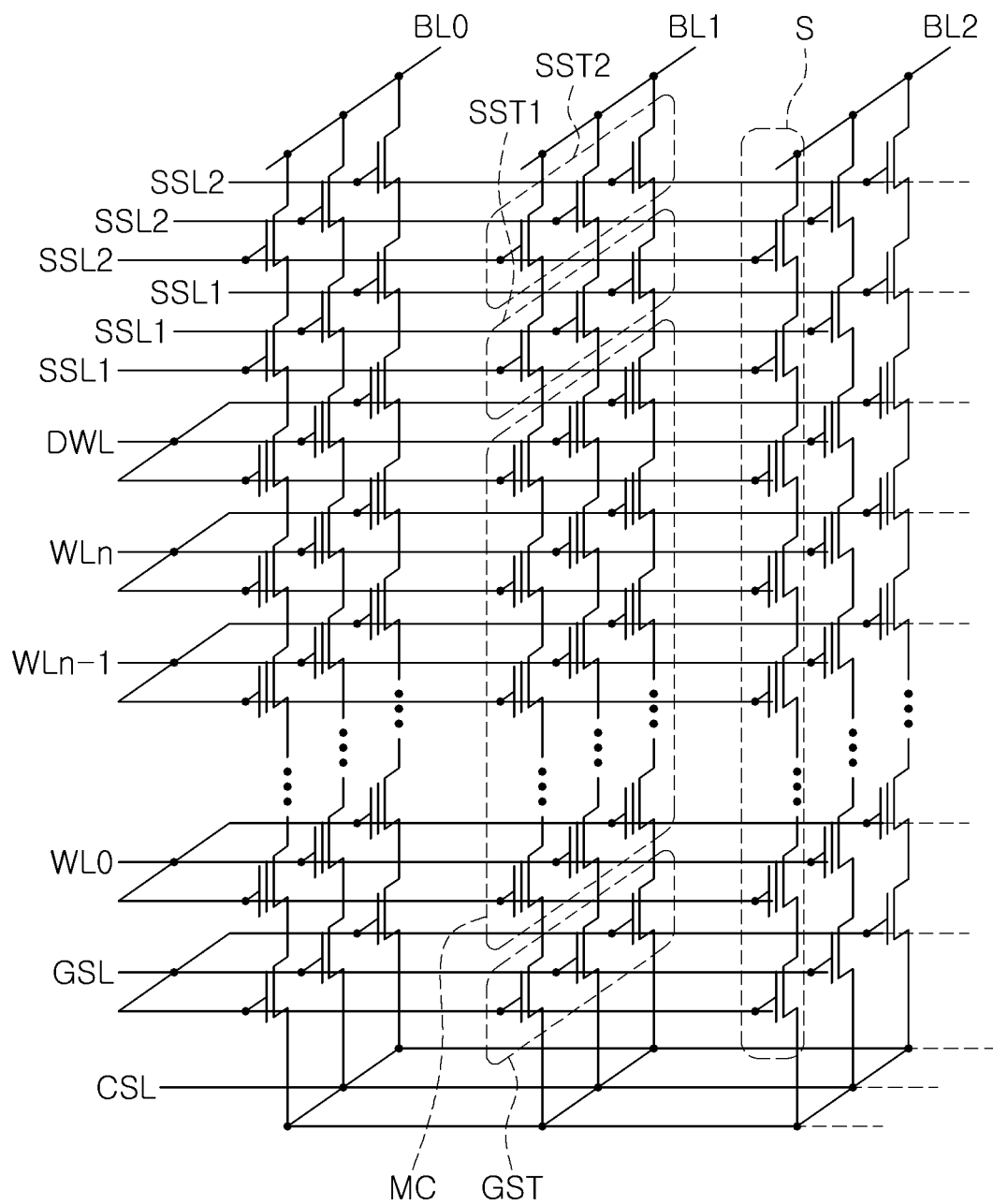
FIG. 2 is an equivalent circuit diagram of a cell array of a semiconductor device according to example embodiments.

FIG. 2 is an equivalent circuit diagram of a cell array of a semiconductor device according to example embodiments.

Referring to FIG. 2, a memory cell array 20 may include a plurality of memory cell strings S including memory cells MC connected to each other in series, a ground select transistor GST connected in series to both ends of the memory cells MC, and string select transistors SST1 and SST2. The plurality of memory cell strings S may be connected to bitlines BL0 to BL2 in parallel. The plurality of memory cell strings S may be commonly connected to a common source line CSL. For example, the plurality of memory cell strings S may be arranged between the bitlines BL0 to BL2 and a single common source line CSL. In an example embodiment, a plurality of common source lines CSL may be arranged two-dimensionally.

The memory cells MC, connected to each other in series, may be controlled by wordlines WL0 to WLn for selecting the memory cells MC. Each of the memory cells MC may include a data storage element. Gate electrodes of the memory cells MC, arranged at substantially the same distance from the common source line CSL, may be commonly connected to one of the wordlines WL0 to WLn to be in an equipotential state. Alternatively, even when the gate electrodes of the memory cells MC are arranged at substantially the same distance from the common source lines CSL, the gate electrodes arranged in different rows or columns may be independently controlled.

The ground select transistor GST may be controlled by the ground selection line GSL, and may be connected to the common source line CSL. The string select transistors SST1 and SST2 may be controlled by string selection lines SSL1 and SSL2, and may be connected to the bitlines BL0 to BL2. In FIG. 2, one ground select transistor GST and two string select transistors SST1 and SST2 are illustrated as being connected to the plurality of memory cells MC connected in series. However, one of the transistors SST1 and SST2 may be respectively connected thereto, or a plurality of the ground select transistors GST may be respectively connected thereto. One or more dummy lines DWL, or a buffer line, may be further disposed between an uppermost wordline WLn among the wordlines WL0 to WLn and the string selection lines SSL1 and SSL2. In an example embodiment, the one or more dummy lines DWL may be disposed between a lowermost wordline WL0 and the ground selection line GSL.

When a signal is applied to the string select transistors SST1 and SST2 via the string selection lines SSL1 and SSL2, a signal applied through the bitlines BL0 to BL2 may be transferred to the memory cells MC, connected to each other in series, to perform a reading operation and a writing operation. In addition, an erasing operation may be performed to erase data, recorded in the memory cells MC, by applying a predetermined erasing voltage through the substrate. In an example embodiment, the memory cell array 20 may include at least one of the dummy memory cell strings electrically separated from the bitlines BL0 to BL2.

Figure 3:
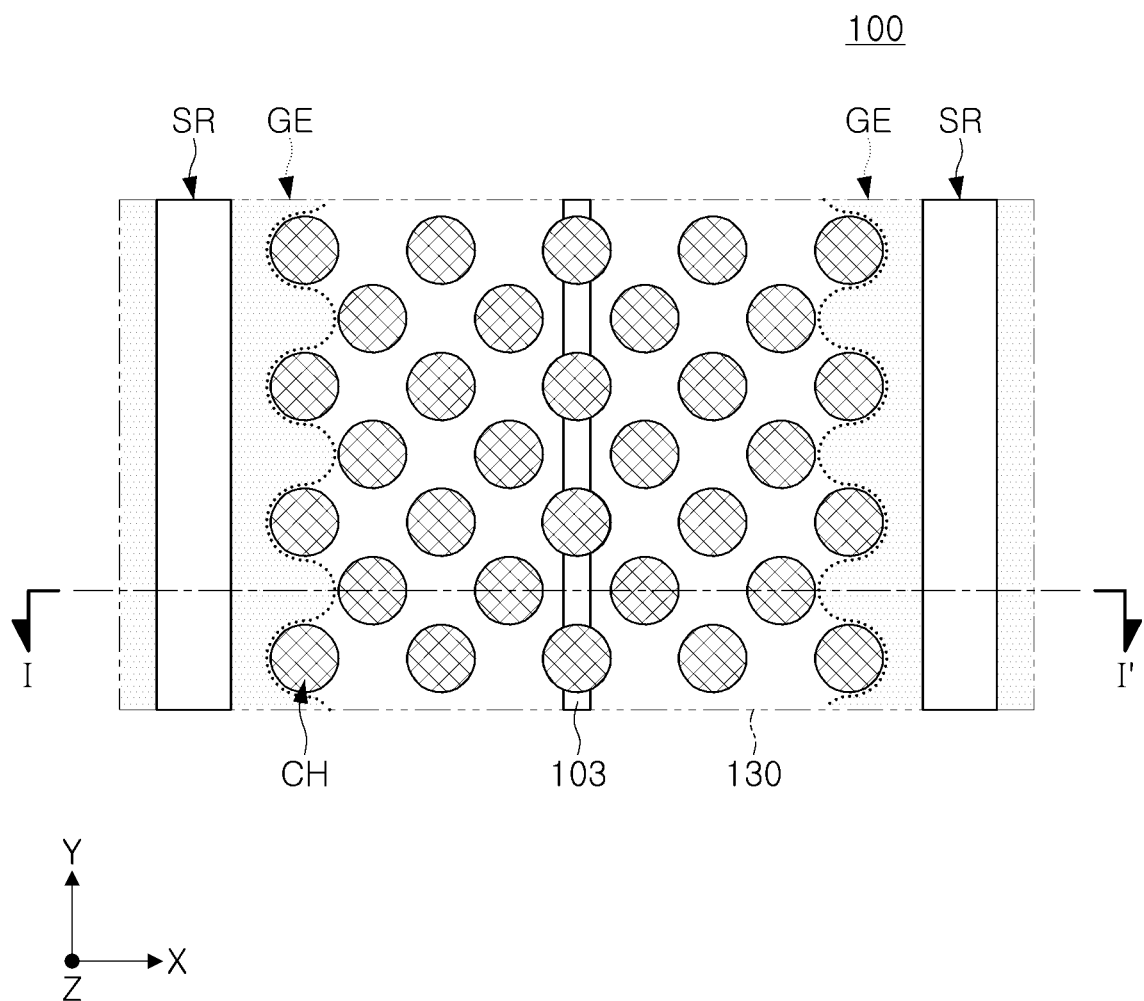
FIG. 3 is a schematic plan view of a semiconductor device according to example embodiments.

FIG. 3 is a schematic plan view of a semiconductor device according to example embodiments.

Figure 4:
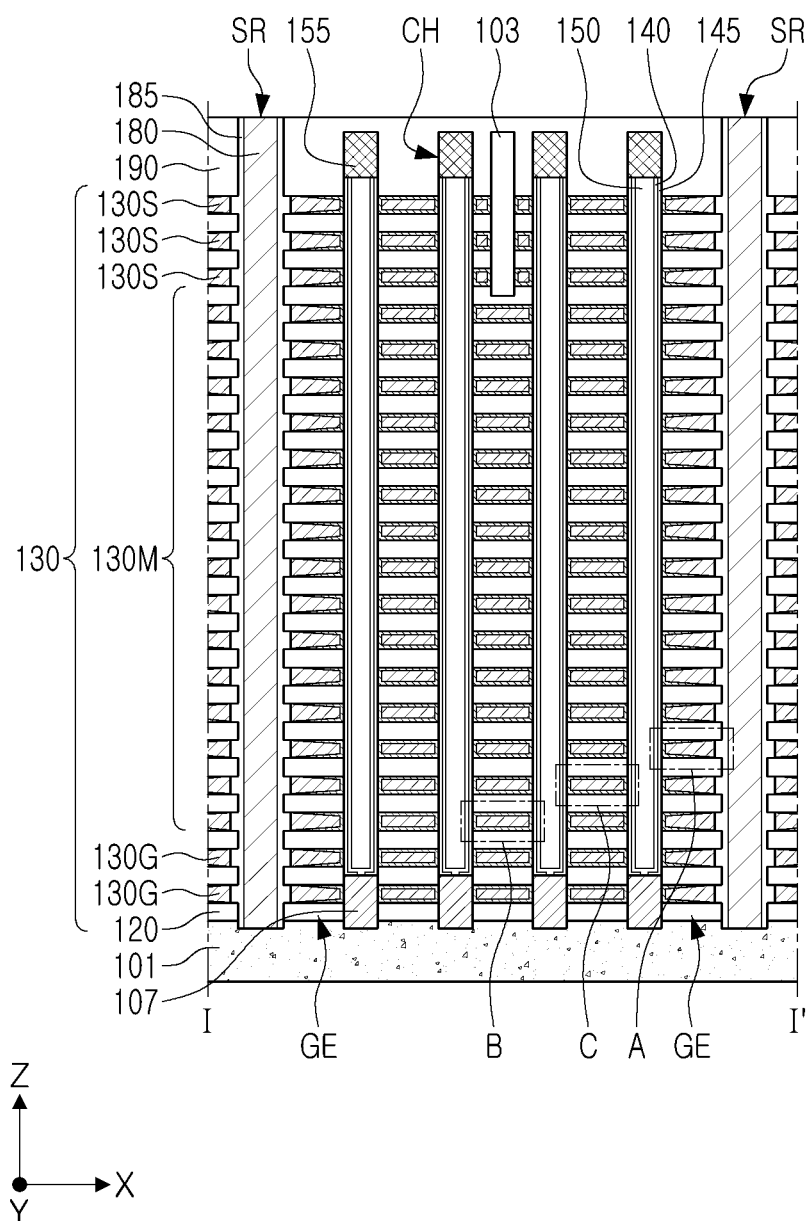
FIG. 4 is a schematic cross-sectional view of a semiconductor device according to example embodiments.

FIG. 4 shows a cross-sectional view of the semiconductor device taken along line I-I' of FIG. 3. For ease of description, only main components of the semiconductor device are illustrated in FIGS. 3 and 4.

Figure 5A:
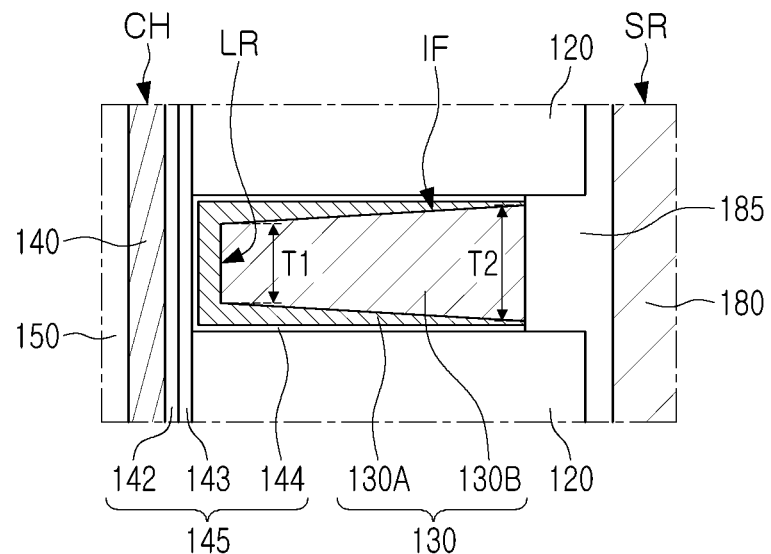
FIGS. 5A to 5C are partially enlarged cross-sectional views of regions A, B and C of FIG. 4 according to example embodiments.
Figure 5B:
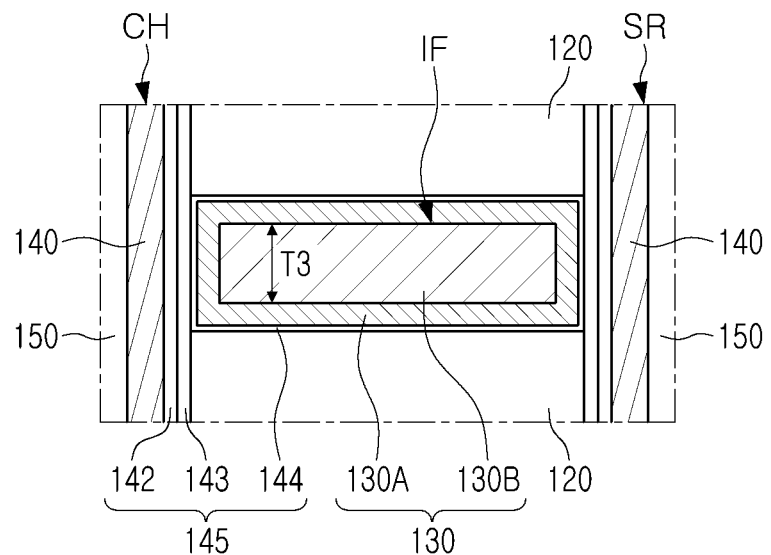
Figure 5C:
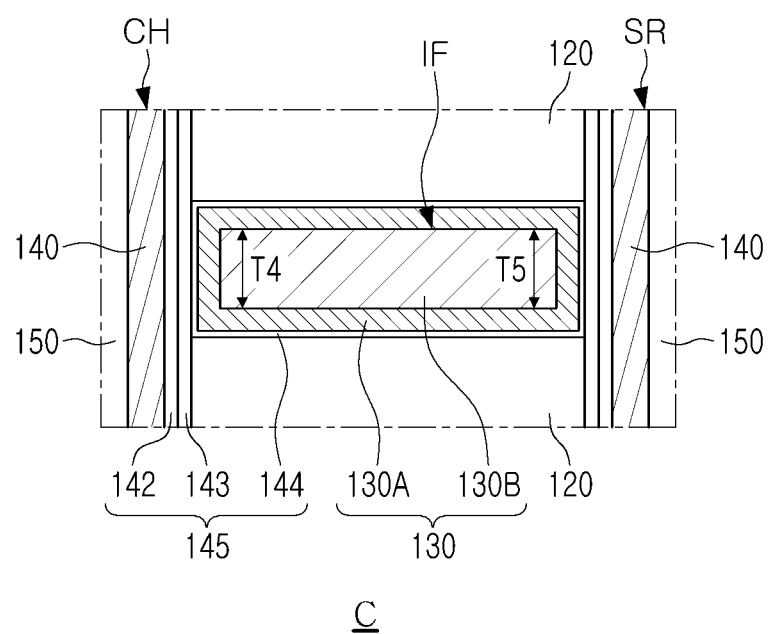

FIGS. 5A to 5C are partially enlarged views of regions A, B, and C of FIG. 4, respectively.

Referring to FIGS. 3 and 4, a semiconductor device 100 may include a substrate 101, channel structures CH, extending in a direction perpendicular to an upper surface of the substrate 101, in which a channel layer 140 is disposed, a plurality of interlayer insulating layers 120 stacked along an external sidewalls of the channel structures CH, a plurality of gate electrodes 130, stacked alternately with the interlayer insulating layers 120, including a first conductive layer 130A and a second conductive layer 130B, and separation regions SR extending through a stacked structure of the interlayer insulting layers 120 and the gate electrodes 130 alternately stacked on the substrate 101. The semiconductor device 100 may further include a gate dielectric layer 145 disposed between the channel layer 140 and the gate electrodes 130, an epitaxial layer 107 disposed below the channel layer 140, channel pads 155 on an upper end of the channel structures CH, and a source conductive layer 180 and a source insulating layer 185 disposed in each of the separation regions SR.

In the semiconductor device 100, a single memory cell string may be configured around each of the channel layer 140, and the plurality of memory cell strings may be arranged in rows and columns in an x direction and a y direction different from the x direction.

The substrate 101 may have an upper surface extending in the x direction and the y direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon on insulator (SOI) layer, a semiconductor on insulator (SeOI) layer, or the like.

The channel structures CH may be disposed on the substrate 101 to be spaced apart from each other in rows and columns. The channel structures CH may be arranged in the form of a lattice, or may be arranged zigzag in one direction. The channel structures CH may have side surfaces perpendicular to the substrate 101, or may have sloped side surfaces narrowed in a direction toward the substrate 101 depending on an aspect ratio. Each of the channel structures CH may include the channel layer 140, the gate dielectric layer 145, the channel pad 155, and the epitaxial layer 107. Each of the channel structures CH may further include a channel insulating layer 150.

In the channel structures CH, the channel layer 140 may be disposed in an annular shape to surround the channel insulating layer 150 therein. In some embodiments, the channel layer 140 may have a pillar shape such as a cylindrical shape or a prismatic shape without the channel insulating layer 150. The channel layer 140 may be connected to the epitaxial layer 107. The channel layer 140 may include a semiconductor material such as polycrystalline silicon or single-crystalline silicon, and the semiconductor material may be an undoped material or a material including p-type or n-type impurities. The channel structures CH, disposed on a straight line in the x direction, may be connected to different bitlines by arrangement of an upper interconnection structure connected to the channel pad 155. A portion of the channel structures CH may be dummy channels which are not connected to the bitlines.

The gate dielectric layer 145 may be disposed between the gate electrodes 130 and the channel layer 140. The gate dielectric layer 145 may include a tunneling layer 142, a charge storage layer 143, and a blocking layer 144 stacked sequentially from the channel layer 140. The channel layer 140, the tunneling layer 142 and the charge storage layer 143 may extend in a z direction perpendicular to the substrate 101. The blocking layer 144 may be disposed to surround at least a portion of the gate electrode 130. In this case, the blocking layer 144 may extend between the first conductive layer 130A and each of two adjacent interlayer insulating layers 120. In some embodiments, the channel layer 140 and the tunneling layer 142 may extend in a z direction and the charge storage layer 143 may also be disposed to surround the gate electrode 130 together with the blocking layer 144. In this case, the charge storage layer 143 and the blocking layer 144 may extend the first conductive layer 130A and each of two adjacent interlayer insulating layers 120. Relative thicknesses of layers, constituting the gate dielectric layer 145, are not limited to those illustrated in the drawings and may vary depending on example embodiments. In FIG. 5A, a side surface of the blocking layer 144 is illustrated as being coplanar with a side surface of the gate electrode 130. However, a shape of the blocking layer 144 is not limited thereto and may further extend toward, for example, side surfaces of the interlayer insulating layers 120 along the interlayer insulating layers 120.

Electrons of the channel layer 140 may tunnel through the tunneling layer 142 to be stored in the charge storage layer 143 by Fowler-Nordheim (FN) tunneling mechanism. The tunneling layer 142 may include, for example, a silicon oxide ($SiO_2$), a silicon nitride ($Si_3N_4$), a silicon oxynitride (SiON), or combinations thereof. The charge storage layer 143 may be a charge trap layer, and may be formed of a silicon nitride. The blocking layer 144 may include a silicon oxide ($SiO_2$), a silicon nitride ($Si_3N_4$), a silicon oxynitride (SiON), a high-k dielectric, or combinations thereof. The term "high-k dielectric" refers to a dielectric material having a higher dielectric constant than a silicon oxide ($SiO_2$). The high-k dielectric may include, for example, an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or combinations thereof.

The epitaxial layer 107 may be disposed on the substrate 101 in the lower portion of the channel structures CH, and may be disposed on a side surface of the at least one gate electrode 130. The epitaxial layer 107 may be disposed in a recessed region of the substrate 101. An upper surface of the epitaxial layer 107 may have a height greater than a height of an upper surface of the lowermost gate electrode 130 and less than a height of a lower surface of the upper gate electrode 130 adjacent to the lowermost gate electrode 130, but the height of the upper surface of the epitaxial layer 107 is not limited thereto. Even when an aspect ratio of the channel structure CH is increased, the channel layer 140 may be stably electrically connected to the substrate 101 by the epitaxial layer 107 and characteristics of the ground select transistor GST between memory cell strings may be uniform. In some embodiments, the epitaxial layer 107 may be omitted. In this case, the channel layer 140 may be directly connected to the substrate 101.

The channel pad 155 may be disposed above the channel layer 140 in the channel structures CH. The channel pad 155 may be disposed to cover an upper surface of the channel insulating layer 150 and to be electrically connected to the channel layer 140. The channel pads 155 may include, for example, doped polysilicon.

The gate electrodes 130 may be disposed to be spaced apart from each other in a direction perpendicular to the substrate 101 along a side surface of each of the channel structures CH. The gate electrodes 130 may include a ground select electrode 130G, a cell electrode 130M, and a string select electrode 130S, which constitute gate electrodes of a ground select transistor, a plurality of memory cells, and a string select transistor, respectively. The gate electrodes 130 may extend while forming a ground select line, wordlines, and a string select line. The wordlines may be commonly connected in adjacent memory cell strings of a predetermined unit arranged in the x and y directions. The string select electrode 130S, constituting the string select line, may be separated from each other at regular intervals in the x direction by an upper insulating layer 103. However, the number of the string selection electrodes 130S, separated by the upper insulating layer 103, is not limited to the number illustrated in the drawings.

In some embodiments, one or more string select electrodes 130S and one or more ground select electrodes 130G may be provided, and may have the same or different structures as the cell electrodes 130M. Some gate electrodes 130, for example, gate electrodes 130, adjacent to the string select electrodes 130S or the ground select electrodes 130G, may be dummy gate electrodes.

Referring to FIGS. 5A to 5C, each of the gate electrodes 130 may include a first conductive layer 130A, adjacent to the interlayer insulating layers 120 and the channel structure CH, and a second conductive layer 130B on the first conductive layer 130A.

The first conductive layer 130A may be disposed on upper and lower surfaces of the interlayer insulating layers 120 and may be disposed on sidewalls of the channel structure CH. Accordingly, the first conductive layer 130A may be disposed to have a laterally recessed region LR toward the channel structure CH. The first conductive layer 130A may be interposed between a portion of the gate dielectric layer 145 and the second conductive layer 130B. For example, the first conductive layer 130A may be interposed between the blocking layer 144 of the gate dielectric layer 145 and the second conductive layer 130B. In this case, the blocking layer 144 may be disposed between the channel layer 140 and the first conductive layer 130 and between each of two adjacent interlayer insulating layers 120 and the first conductive layer 130.

The first conductive layer 130A may decrease in thickness on the upper and lower surfaces of the interlayer insulating layers 120 from an outermost channel structure CH adjacent to the separation region SR in the x direction to the separation region SR. For example, when a region of the gate electrode 130 adjacent to the separation region SR is referred to as an edge region GE, the first conductive layer 130A may decrease in thickness in a direction toward the separation region SR in at least the edge region GE, as illustrated in FIG. 5A. Accordingly, the laterally recessed region LR may have a larger width in a z direction in a region adjacent to the separation region SR than in a region adjacent to the channel structure CH. In an example embodiment, the laterally recessed region LR may have a decreasing width toward the channel structure CH in the x direction. In particular, the edge region GE may include a region between channel structures CH adjacent to the separation region SR in the x direction and the separation region SR.

The second conductive layer 130B may be disposed to fill an internal side (i.e., the laterally recessed region LR) of the first conductive layer 130A between two interlayer insulating layers 120 that are vertically adjacent to each other. According to a shape of the first conductive layer 130A, the second conductive layer 130B may have a first thickness T1 in a region, distant from the separation region SR, and a second thickness T2, greater than the first thickness T1, in a region adjacent to the separation region SR and may have an increasing thickness toward the separation region SR. The upper surface of the second conductive layer 130B may have an increasing height toward the separation region SR. The thickness increase of the second conductive layer 130B may be continuous. However, the present inventive concept is not limited thereto. In some embodiments, the second conductive layer 130B may have a shape in which the height is increased stepwise in a staircase form or increased gradually and stepwise in a direction toward the separation region SR.

For example, the first conductive layer 130A may have a thickness ranging from about 0.1 nm to about 3 nm and the second conductive layer 130B may have a thickness ranging from about 10 nm to about 30 nm on an internal side of the first conductive layer 130A. In an example embodiment, the first conductive layer 130A and the second conductive layer 130B may be substantially symmetrical between two adjacent separation regions SR in the x direction. For example, an uppermost gate electrode 130 (e.g., the string select electrode 130S) may be symmetrical with respect to the upper insulating layer 103, and a gate electrode 130 below the uppermost gate electrode 130 (e.g., the cell electrode 130M) may be symmetrical with respect to an extending region of the upper insulating layer 103 in the z direction. In an exemplary embodiment, the upper insulating layer 103 and its extending region in the z direction may be positioned in a center region between the two adjacent separation regions SR. In this case, the gate electrode 130 including the first conductive layer 130A and the second conductive layer 130B may be symmetrical with respect to the center region of the two adjacent separation regions SR.

The first conductive layer 130A and the second conductive layer 130B may include the same material or different materials. The first conductive layer 130A and the second conductive layer 130B may include a metal material such as tungsten (W), cobalt (Co), molybdenum (Mo), ruthenium (Ru), nickel (Ni), or the like. In some embodiments, the first conductive layer 130A and the second conductive layer 130B may include polycrystalline silicon or a metal silicide material. In some embodiments, the gate electrodes 130 may further include a diffusion barrier layer to protect the channel structures CH in the process of forming the gate electrodes 130. In this case, the diffusion barrier layer may be disposed between the first conductive layer 130A and each of the channel structures CH and between the first conductive layer 130A and each of the two adjacent interlayer insulating layers 120.

The first conductive layer 130A and the second conductive layer 130B may have an interface IF therebetween that may be identified by, for example, a transmission electron microscopy (TEM). For example, even when the materials of the first conductive layer 130A and the second conductive layer 130B are identical to each other, the interface IF may be recognized due to discontinuity of a crystal structure, as, for example, grain boundaries. In an example embodiment, the grain boundaries between the first conductive layer 130A and the second conductive layer 130B may be continuous or discontinuous. An interface IF between the first conductive layer 130A and the second conductive layer 130B may form a sloped surface. For example, the interface IF between the first conductive layer 130A and the second conductive layer 130B may be sloped with respect to the x-direction in the edge region GE. The first conductive layer 130A and the second conductive layer 130B are illustrated as being recessed toward the channel layer 140 by a predetermined distance from a side surface of the interlayer insulating layer 120 in contact with the separation region SR, a shape of the first conductive layer 130A and the second conductive layer 130B is not limited thereto. For example, the first conductive layer 130A and the second conductive layer 130B may have sidewalls, adjacent to the separation region SR, coplanar with the interlayer insulating layers 120.

As illustrated in FIG. 5B, the first conductive layer 130A and the second conductive layer 130B have a substantially uniform thickness in a first region spaced farthest apart from the separation regions SR. Accordingly, the interface IF may also be a substantially planar surface. For example, the interface IF may be substantially parallel to the x direction. The second conductive layer 130B may have a third thickness T3, and the third thickness T3 may less than or equal to the first thickness T1. This is because the first conductive layer 130A has a thickness greater than or equal to a maximum thickness in the edge region GE.

As illustrated in FIG. 5C, in a second region between the first region and the edge region GE, the first conductive layer 130A and the second conductive layer 130B have a substantially uniform thickness, or may have thicknesses decreased and increased in a direction toward the edge region GE, respectively. Accordingly, the interface IF may also be substantially parallel to the x direction or sloped with respect to the x direction. The second conductive layer 130B may have a fourth thickness T4 and a fifth thickness T5 on opposite ends adjacent to the channel structures CH. In some embodiments, the fourth thickness T4 may be substantially the same as the fifth thickness T5 or less than the fifth thickness T5. The fourth thickness T4 may be greater than or equal to the third thickness T3, and the fifth thickness T5 may be less than or equal to the first thickness T1. This is because the thickness of the first conductive layer 130A in the second region may be higher than or equal to the maximum thickness in the edge region GE.

In example embodiments, the thickness of the first conductive layer 130A may be gradually decreased in the x direction from the first region to the edge region GE via the second region. Alternatively, the first conductive layer 130A may have substantially the same thickness as the maximum thickness of the edge region GE in the first region and the second region, and may have a thickness decreased only in the edge region GE.

The interlayer insulating layers 120 may be disposed between the gate electrodes 130. Similar to the gate electrodes 130, the interlayer insulating layers 120 may be disposed to be spaced apart from each other in the z direction perpendicular to the upper surface of the substrate 101 and may extend in the x direction. The interlayer insulating layers 120 may include an insulating material such as silicon oxide or silicon nitride. Side surfaces of the interlayer insulating layers 120 may have a structure protruding from the side surfaces of the gate electrodes 130 to the separation region SR. However, in example embodiments, side surfaces of the interlayer insulating layers 120 may be coplanar with side surfaces of the gate electrodes 130.

The separation regions SR may extend through the gate electrodes 130 and the interlayer insulating layers 120 between the channel structures CH in the z direction, and may be connected to the substrate 101. The source conductive layer 180 and the source insulating layer 185 may be disposed in the separation regions SR. The source conductive layer 180 may have a shape in which a width is decreased in a direction toward the substrate 101 due to a high aspect ratio, but a shape of the source conductive layer 180 is not limited thereto. The source conductive layer 180 may have a side surface perpendicular to the upper surface of the substrate 101.

The source conductive layer 180 may be electrically insulated from the gate electrodes 130 by the source insulating layer 185. Accordingly, stacked structures of the gate electrodes 130 may be separated from each other in the x direction by the source conductive layer 180 interposed therebetween. The source conductive layer 180 may be disposed in the form of a line extending in the y direction and may correspond to a common source line of the semiconductor device 100. The source conductive layer 180 may be repeatedly arranged at a predetermined interval in the x direction, for example, every four columns to eight columns of the channel structures CH, but the arrangement of the source conductive layer 180 is not limited thereto. The source insulating layer 185 may partially extend and protrude between the interlayer insulating layers 120 to be in contact with side surfaces of the gate electrodes 130. For example, the source insulating layer 185 may include a plurality of protrusions each of which is contact with a side surface of a corresponding one of the gate electrodes 130 and is disposed between two adjacent interlayer insulating layers 120. The source conductive layer 180 may include a conductive material such as polycrystalline silicon, metal, or the like, and the source insulating layer 185 may include an insulating material such as silicon oxide, silicon nitride, or the like. In some embodiments, the separation regions SR may be filled with only an insulating material without the source conductive layer 180. In this case, a region corresponding to the common source line may be disposed in the substrate 101 or on the substrate 101.

The cell region insulating layer 190 may be disposed on the stacked structure of the gate electrodes 130 and may include an insulating material such as silicon oxide, silicon nitride, or the like.

Figure 6A:
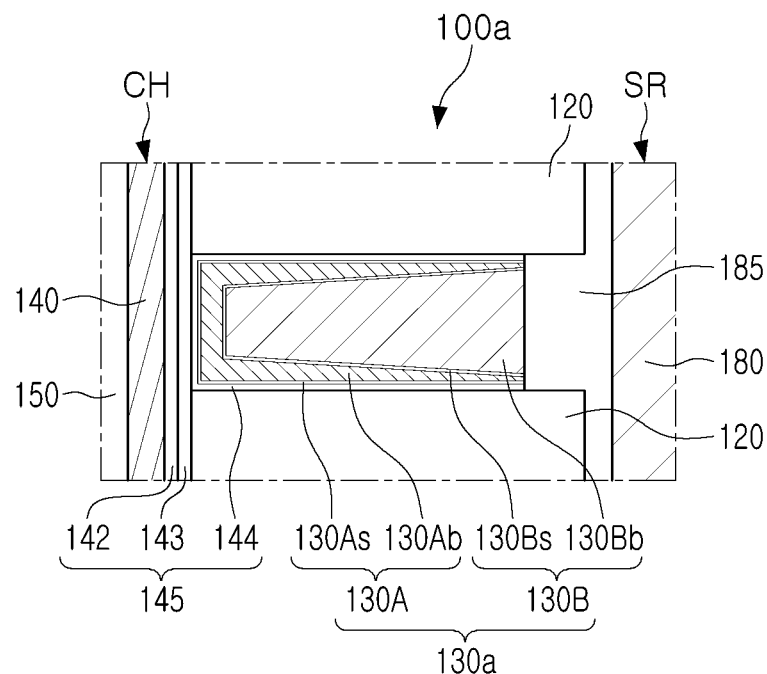
FIGS. 6A and 6B are partially enlarged cross-sectional views of a semiconductor device according to example embodiments.
Figure 6B:
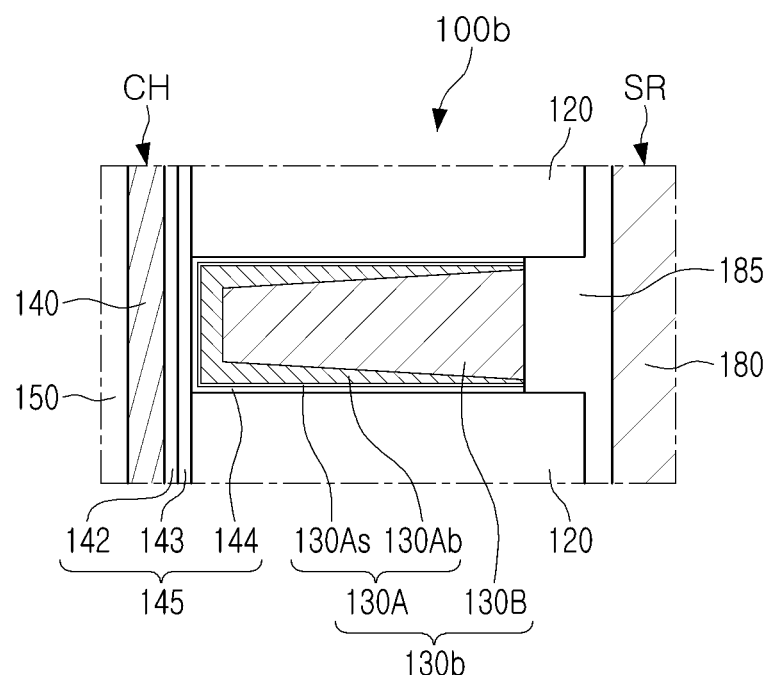

FIGS. 6A and 6B are partially enlarged cross-sectional views of semiconductor devices according to example embodiments. FIGS. 6A and 6B illustrate enlarged versions of regions corresponding to the region A of FIG. 4.

Referring to FIG. 6A, in a semiconductor device 100a, a first conductive layer 130A and a second conductive layer 130B may include first and second nucleation layers 130As and 130Bs and first and second bulk layers 130Ab and 130Bb, respectively.

The first and second nucleation layers 130As and 130Bs may are formed first to provide a nucleation site to assist nucleation for growth of subsequent first and second bulk layers 130Ab and 130Bb. The first and second bulk layers 130Ab and 130Bb may be respectively grown based on the first and second nucleation layers 130As and 130Bs to have desired thicknesses.

The first and second nucleation layers 130As and 130Bs and the first and second bulk layers 130Ab and 130Bb may be formed under different process conditions and may have different thicknesses. In example embodiments, the first and second nucleation layers 130As and 130Bs have an amorphous structure, while the first and second bulk layers 130Ab and 130Bb have a crystalline structure. For example, the first and second nucleation layers 130As and 130Bs and the first and second bulk layers 130Ab and 130Bb may be formed using different reactant gases, and may be formed at different deposition rates. Each of the first and second nucleation layers 130As and 130Bs may have a thickness of about 3 nm or less, for example, a thickness ranging from about 10 angstroms to about 20 angstroms, and may have a substantially uniform thickness. The first bulk layer 130Ab may have a thickness decreased on one surface of the interlayer insulating layer 120 in a direction toward the separation region SR, and the second bulk layer 130Bb have a thickness increased in a direction toward the separation region SR. In some embodiments, the first and second nucleation layers 130As and 130Bs and the first and second bulk layers 130Ab and 130Bb may include different impurities.

For example, when the gate electrode 130 is formed of tungsten (W) and $WF_6$ is used as a source gas, the first and second nucleation layers 130As and 130Bs may serve to prevent diffusion of residual fluorine (F). Accordingly, the first and second nucleation layers 130As and 130Bs may prevent fluorine (F) in the gate electrode 130 from being diffused to the gate dielectric layer 145, thereby preventing deterioration in electrical characteristics of the semiconductor device 100a.

Referring to FIG. 6B, in a semiconductor device 100b, a first conductive layer 130A may include a first nucleation layer 130As and a first bulk layer 130Ab, and a second conductive layer 130B may substantially include only the same layer as a bulk layer without a nucleation layer.

In the present embodiment, the second conductive layer 130B is provided on the first conductive layer 130A without forming a nucleation layer thereon. In this case, process efficiency may be increased as compared with the example embodiment of FIG. 6A.

Figure 7:
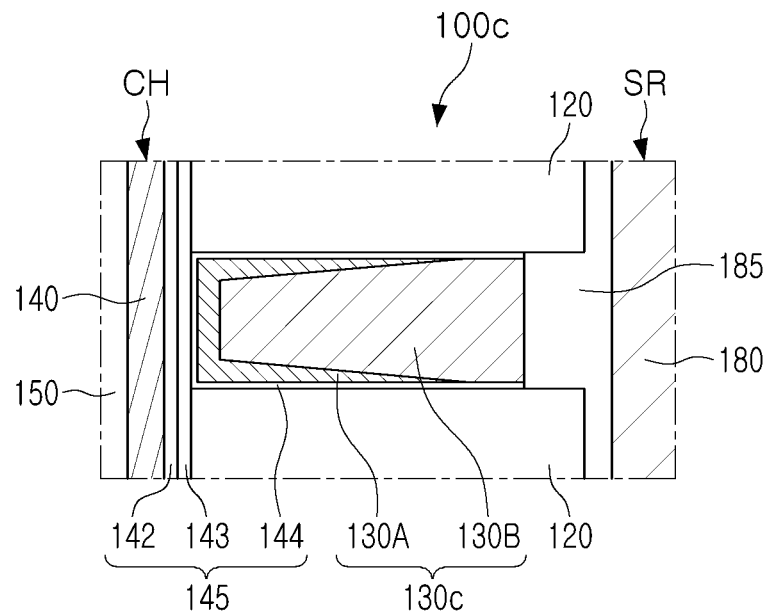
FIGS. 7 and 8 are partially enlarged cross-sectional views of a semiconductor devices according to example embodiments.
Figure 8:
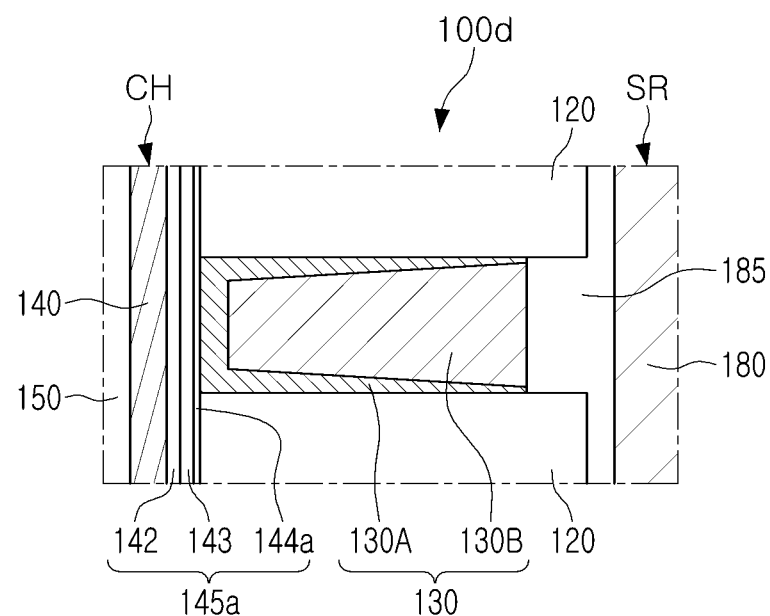

FIGS. 7 and 8 are partially enlarged cross-sectional views of the region A of FIG. 4.

Referring to FIG. 7, in a semiconductor device 100c, a first conductive layer 130A may extend to a separation region SR to be shorter than a blocking layer 144 of a gate dielectric layer 145. Accordingly, the first conductive layer 130A may not be disposed in at least one region on the blocking layer 144, and a second conductive layer 130B may be in contact with the blocking layer 144. The term "contact," as used herein, refers to a direct connection (i.e., touching) unless the context indicates otherwise. More specifically, the second conductive layer 130B may fill a space between the blocking layer 144 on upper and lower interlayer insulating layers 120 in a region adjacent to the separation region SR. In example embodiments, a length of the region, in which the first conductive layer 130A is not disposed on the blocking layer 144, may be variously changed.

Referring to FIG. 8, in a semiconductor device 100d, a blocking layer 144a of a gate dielectric layer 145a may be disposed to extend in a direction perpendicular to an upper surface of a substrate 101, similar to a channel structure CH, rather than in a horizontal direction along a gate electrode 130. Accordingly, a first conductive layer 130A of a gate electrode 130 may be in contact with interlayer insulating layers 120.

Figure 9:
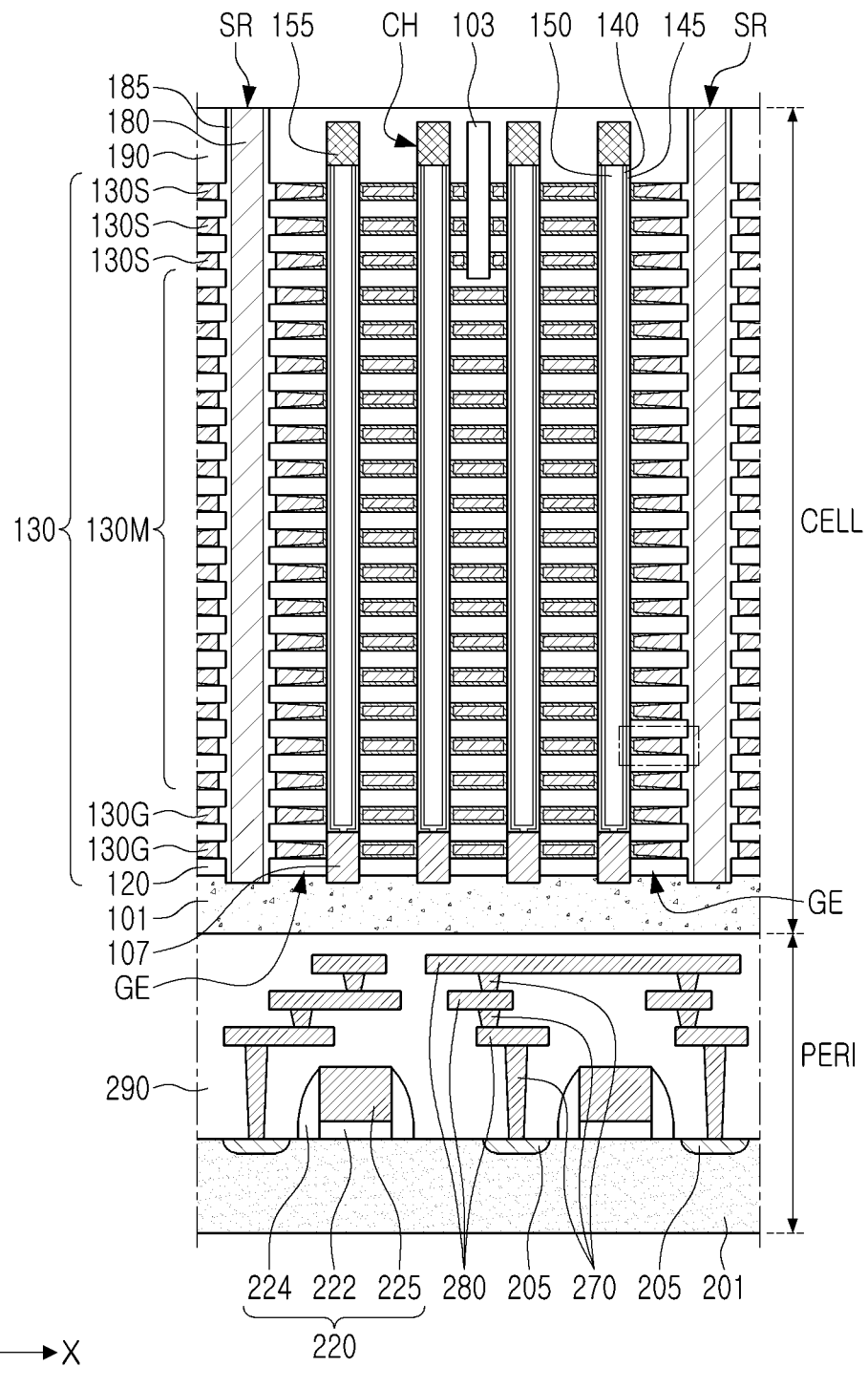
FIG. 9 is a schematic cross-sectional view of a semiconductor device according to example embodiments.

FIG. 9 is a schematic cross-sectional view of a semiconductor device according to example embodiments.

Referring to FIG. 9, a semiconductor device 200 may include a memory cell region CELL and a peripheral circuit region PERI, which are vertically stacked. The memory cell region CELL may be disposed on an upper surface of the peripheral circuit region PERI. For example, the semiconductor device 100 of FIG. 4 includes the peripheral circuit region PERI disposed on the substrate 101 in a region, not illustrated, while the semiconductor device 200 according to the present embodiment may include the memory cell region CELL and the peripheral circuit region PERI stacked vertically. In example embodiments, the cell region CELL may be disposed below the peripheral circuit region PERI. The descriptions, made with reference to FIGS. 3 and 4, may be identically applied to the description of the memory cell region CELL.

The peripheral circuit region PERI may include a base substrate 201, circuit elements 220 disposed on the base substrate 201, circuit contact plugs 270, and circuit interconnection lines 280.

The base substrate 201 may have an upper surface extending in an x direction and a y direction. In the base substrate 201, isolation layers may be formed to define an active region. Source/drain regions 205, including impurities, may be disposed in a portion of the active region. The base substrate 201 may include a semiconductor material, for example, a group IV semiconductor, a group III-V compound semiconductor, or a group II-VI compound semiconductor.

The circuit elements 220 may include planar transistors. Each of the circuit elements 220 may include a circuit gate dielectric layer 222, a spacer layer 224, and a circuit gate electrode 225. Source/drain regions 205 may be disposed in the base substrate 201 on opposite sides adjacent to the circuit gate electrode 225.

A peripheral region insulating layer 290 may be disposed on the circuit element 220 on the base substrate 201. Circuit contact plugs 270 may be connected to the source/drain regions 205 through the peripheral region insulating layer 290. Electrical signals may be applied to the circuit element 220 by the circuit contact plugs 270. In a region, not illustrated, the circuit contact plugs 270 may also be connected to the circuit gate electrode 225. The circuit interconnection lines 280 may be connected to the circuit contact plugs 270 and may be disposed as a plurality of layers.

In the semiconductor device 200, after the peripheral circuit region PERI is formed, a substrate 101 in the memory cell region CELL may be formed on the peripheral circuit region PERI to form the memory cell region CELL. The substrate 101 may be formed to have the same size as the base substrate 201 or to have a smaller size than the base substrate 201. The memory cell area CELL and the peripheral circuit area PERI may be connected to each other in a region, not illustrated. For example, one end of the gate electrode 130 in the y direction may be electrically connected to the circuit elements 220.

Figure 10:
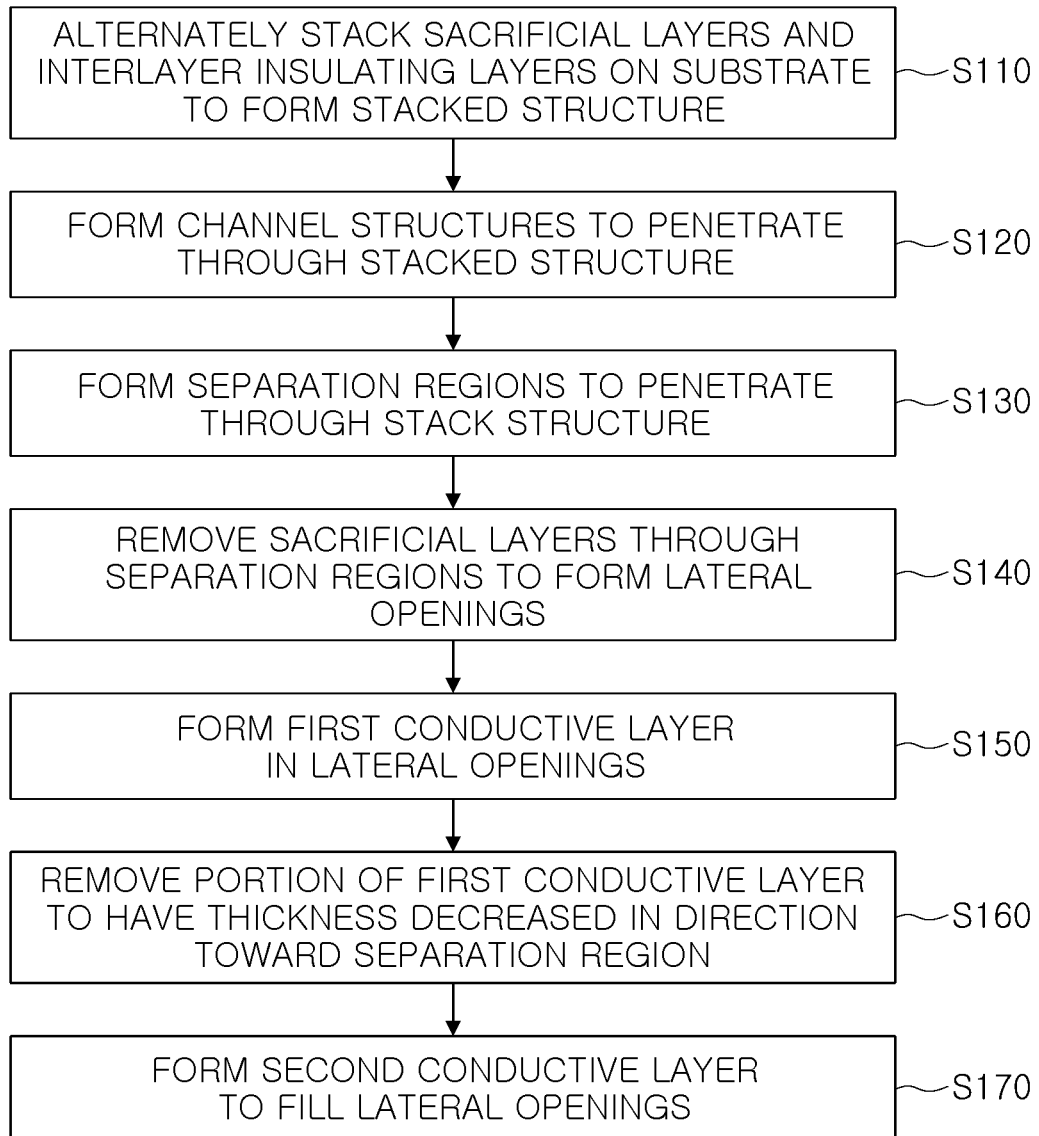
FIG. 10 is a flowchart illustrating a method of manufacturing a semiconductor device according to example embodiments.

FIG. 10 is a flowchart illustrating a method of manufacturing a semiconductor device according to example embodiments.

FIGS. 11A to 11I are cross-sectional views showing the steps in a method of manufacturing the semiconductor device of FIG. 4 according to example embodiments.

Figure 11A:
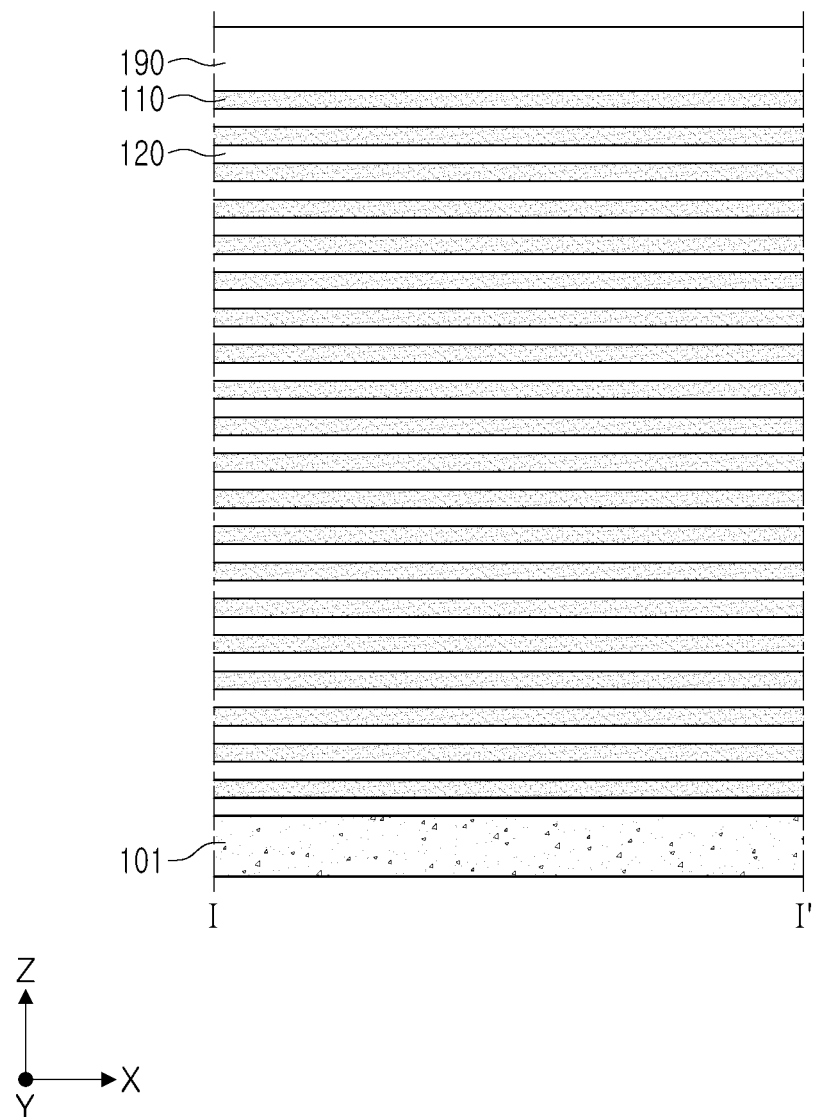
FIGS. 11A to 11I are cross-sectional views showing steps in a method of manufacturing a semiconductor device according to example embodiments.

Referring to FIGS. 10 and 11A, sacrificial layers 110 and interlayer insulating layers 120 may be alternately stacked on the substrate 101 to form a stacked structure (S110).

The sacrificial layers 110 may be replaced with gate electrodes 130 in a subsequent process. The sacrificial layers 110 may be formed of a material different from a material of the interlayer insulating layers 120. For example, the interlayer insulating layer 120 may be formed of at least one of a silicon oxide and a silicon nitride, and the sacrificial layers 110 may be formed of a material, different from the material of the interlayer insulating layer 120, selected from silicon, a silicon oxide, a silicon carbide, and a silicon nitride. In example embodiments, thicknesses of the interlayer insulating layers 120 may not all be equal to each other. For example, a lowermost interlayer insulating layer 120 may be formed to have a relatively large thickness, and an uppermost interlayer insulating layer 120 may be formed to have a relatively small thickness. The thicknesses of the interlayer insulating layers 120 and the sacrificial layers 110 and the number of layers, constituting the same, may be variously changed from those illustrated in the drawings. A cell region insulating layer 190 may be formed on an uppermost portion.

Figure 11B:
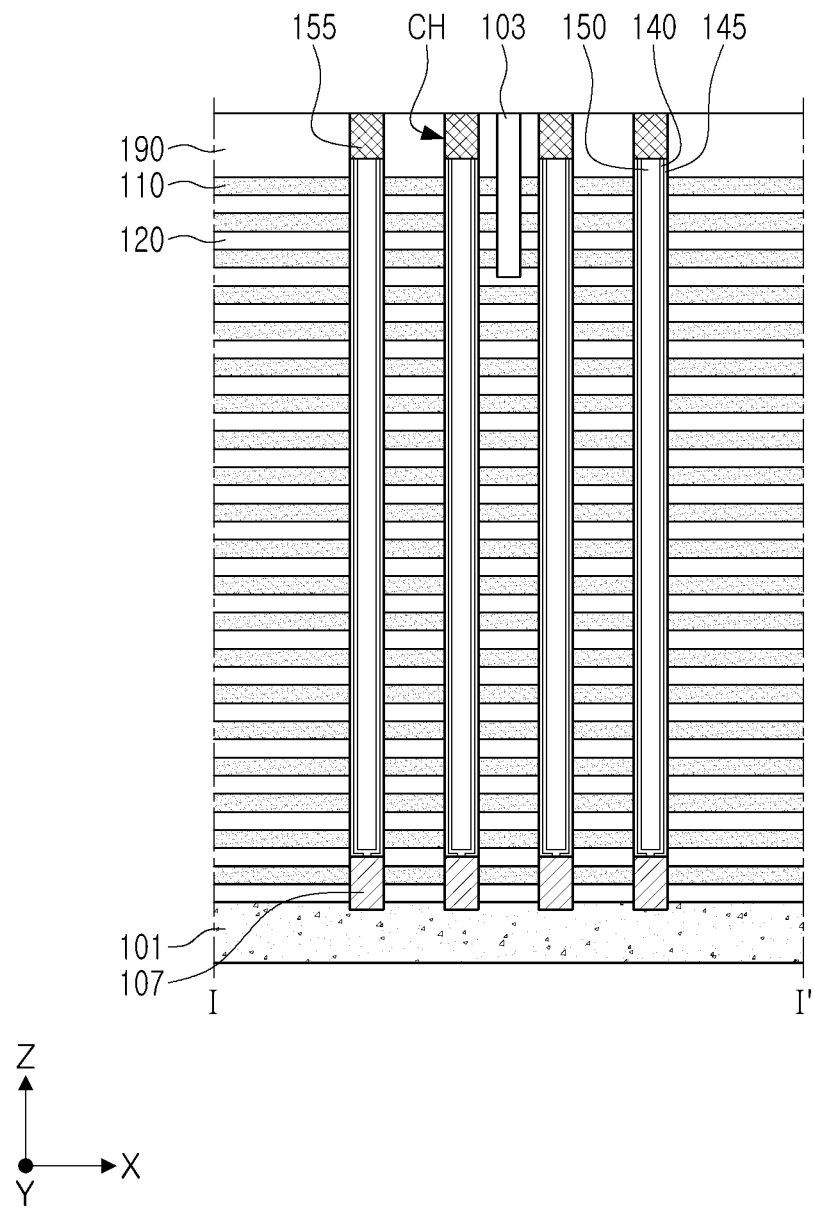

Referring to FIGS. 10 and 11B, an upper insulating layer 103 may be formed, and channel structures CH may be formed to penetrate through the stacked structure (S120).

The upper insulating layer 103 may be formed by removing a predetermined number of sacrificial layers 110 and interlayer insulating layers 120 from an uppermost portion of the stacked structure using an additional mask layer. The upper insulating layer 103 may be formed by depositing an insulating material on a region in which the sacrificial layers 110 and the interlayer insulating layers 120 are removed. The upper insulating layer 103 and the interlayer insulating layer 120 may be formed of a material having etching selectivity with respect to the sacrificial layers 110. In an example embodiment, the upper insulating layer 103 may be formed of the same material as the interlayer insulating layer 120.

Next, for formation of channel structure CH, channel holes may be formed. The channel holes may be formed by anisotropically etching the stacked structure, and may be formed in a hole shape, for example. Due to a height of the stacked structure, sidewalls of the channel holes may not be perpendicular to an upper surface of the substrate 101. The channel holes may be formed in a portion of the substrate 101. For example, the portion of the substrate 101, in forming the channel holes, may be recessed from the upper surface of the substrate 101.

Next, an epitaxial layer 107, a gate dielectric layer 145, a channel layer 140, a channel insulating layer 150, and a channel pad 155 may be formed in the channel holes to form a channel structure CH. The epitaxial layer 107 may be formed using a selective epitaxial growth (SEG) process. The epitaxial layer 107 may be formed as a single layer or a plurality of layers, and may include doped or undoped polycrystalline silicon, single-crystalline silicon, polycrystalline germanium, or single-crystalline germanium.

The gate dielectric layer 145 may be formed to have a uniform thickness using atomic layer deposition (ALD) or chemical vapor deposition (CVD). In this process step, the entirety or a portion of the gate dielectric layer 145 may be formed and a portion, extending in a direction perpendicular to the substrate 101 along the channel structures CH, for example, the tunneling layer 142 and the charge storage layer 143 of FIG. 4 may be formed.

The channel layer 140 may be formed on the gate dielectric layer 145 in the channel holes. The channel insulating layer 150 may be formed to fill the channel holes and may be an insulating material. However, in some embodiments, the channel holes may be filled with a conductive material, rather than the channel insulating layer 150. The channel pad 155 may be formed of a conductive material, for example, polycrystalline silicon.

Figure 11C:
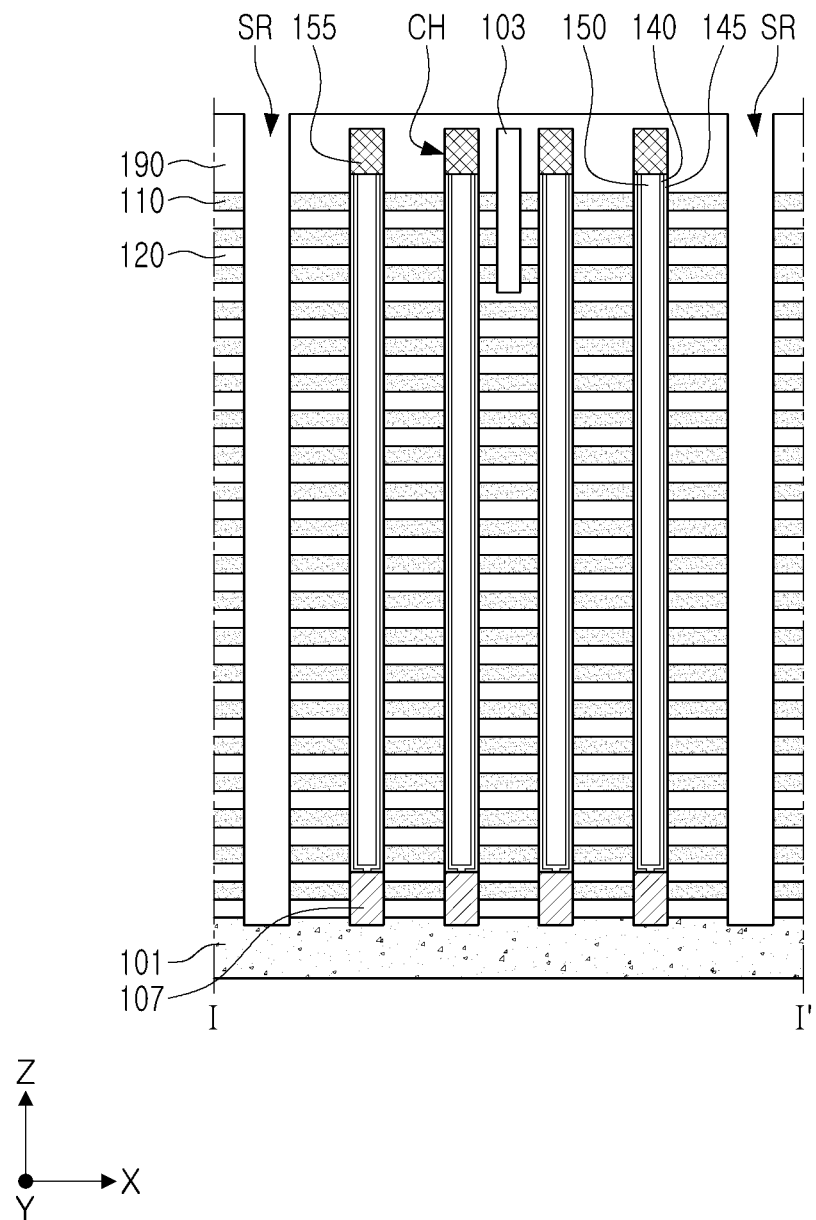

Referring to FIGS. 10 and 11C, separation regions SR may be formed to separate and penetrate through the stacked structure at predetermined intervals (S130).

In example embodiments, before forming the separation regions SR, an additional layer may be formed on the cell region insulating layer 190 and the channel pad 155 to prevent damage to the channel pad 155, the underlying channel layer 140, and the like. In an example embodiment, the additional layer and the cell region insulating layer 190 may be formed of the same material. The separation regions SR may be formed by forming a mask layer using a photolithography process and anisotropically etching the stacked structure of the sacrificial layers 110 and the interlayer insulating layers 120. The separation regions SR may be formed in a shape of trenches extending in the y direction. The source conductive layer 180 and the source insulating layer 185 of FIG. 4 may be disposed in each of the separation regions SR.

Figure 11D:
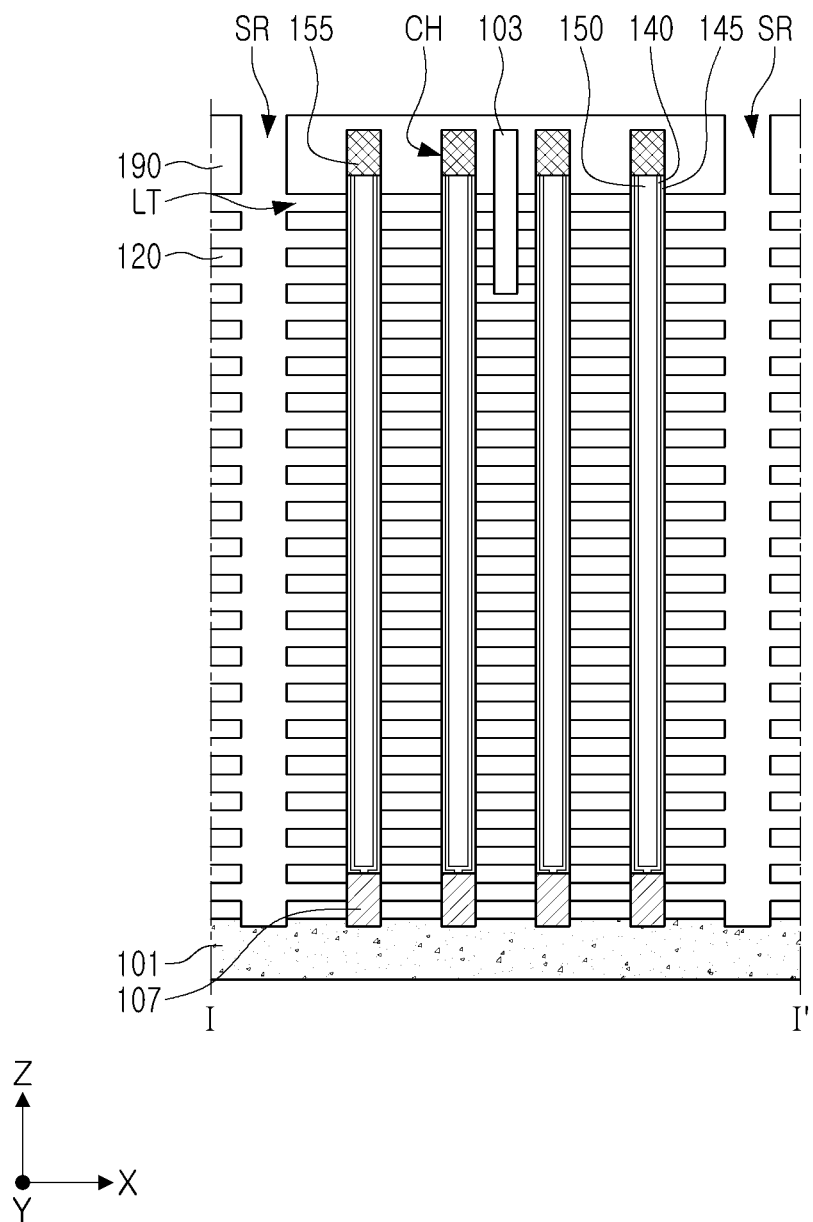

Referring to FIGS. 10 and 11D, lateral openings LT may be formed by removing the sacrificial layers 110 exposed through the separation regions SR (S140).

The sacrificial layers 110 may be selectively removed with respect to the interlayer insulating layers 120 using, for example, wet etching. Accordingly, the lateral openings LT may be formed between the interlayer insulating layers 120, and sidewalls of the channel structures CH may be partially exposed through the lateral openings LT.

Figure 11E:
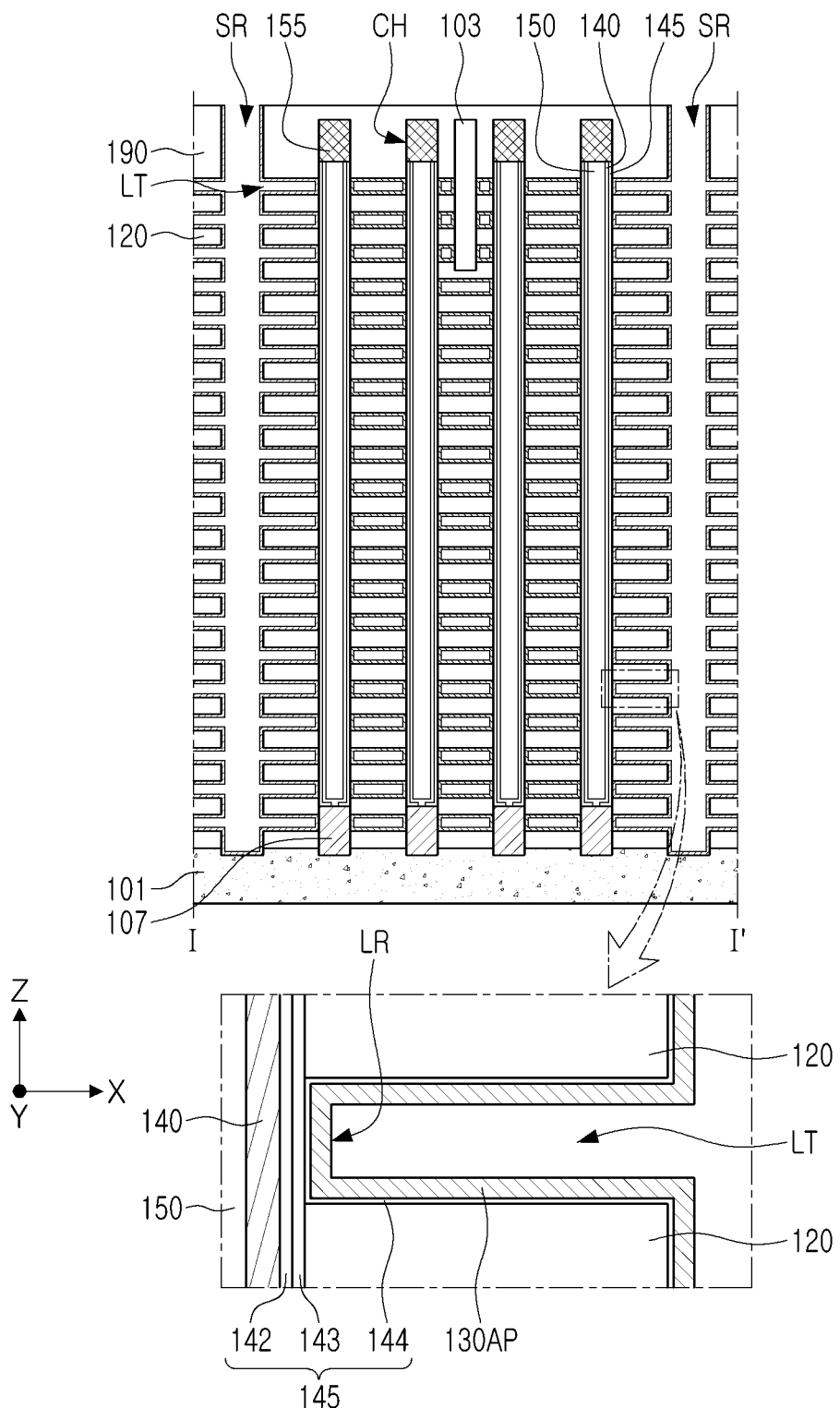

Referring to FIGS. 10 and 11E, a preliminary first conductive layer 130AP of the gate electrode 130 may be formed in the lateral openings LT (S150).

Before forming the preliminary first conductive layer 130AP, a portion of the gate dielectric layer 145, for example, the blocking layer 144 of FIG. 4, may be formed in the lateral openings LT. In some embodiments, when the blocking layer 144 is formed on internal sidewalls of the channel structures CH, the blocking layer 144 may not be formed in this process step and may be formed in advance together with the channel layer 140.

The preliminary first conductive layer 130AP may be formed by, for example, a CVD process or an ALD process. The preliminary first conductive layer 130AP may be formed to have a substantially uniform thickness along the upper and lower surfaces of the interlayer insulating layers 120 and the sidewalls of the channel structures CH, and may have a thickness insufficient to fill the lateral openings LT. Accordingly, the preliminary first conductive layer 130AP may have a laterally recessed region LR formed concavely toward the channel structure CH.

When the preliminary first conductive layer 130AP is formed of tungsten (W), at least one of $WF_6$, $WCl_6$, $WCl_5$, $W(CO)_6$, $W(C_6H_6)_2$, $W(PF_3)_6$, $W(allyl)_4$, and $(1,5\text{-COD})W(CO)_4$, $(C_5H_5)_2WH_2$ may be used as a source gas and at least one of $B_2H_6$, $SiH_4$, and $H_2$ may be used as a reactant gas. Similar to the embodiments of FIGS. 6A and 6B, the preliminary first conductive layer 130AP may include a nucleation layer and a bulk layer. In this case, a reactant gas, used to form the nucleation layer, may have a higher decomposition rate of the source gas than a reactant gas used to form the bulk layer.

Figure 11F:
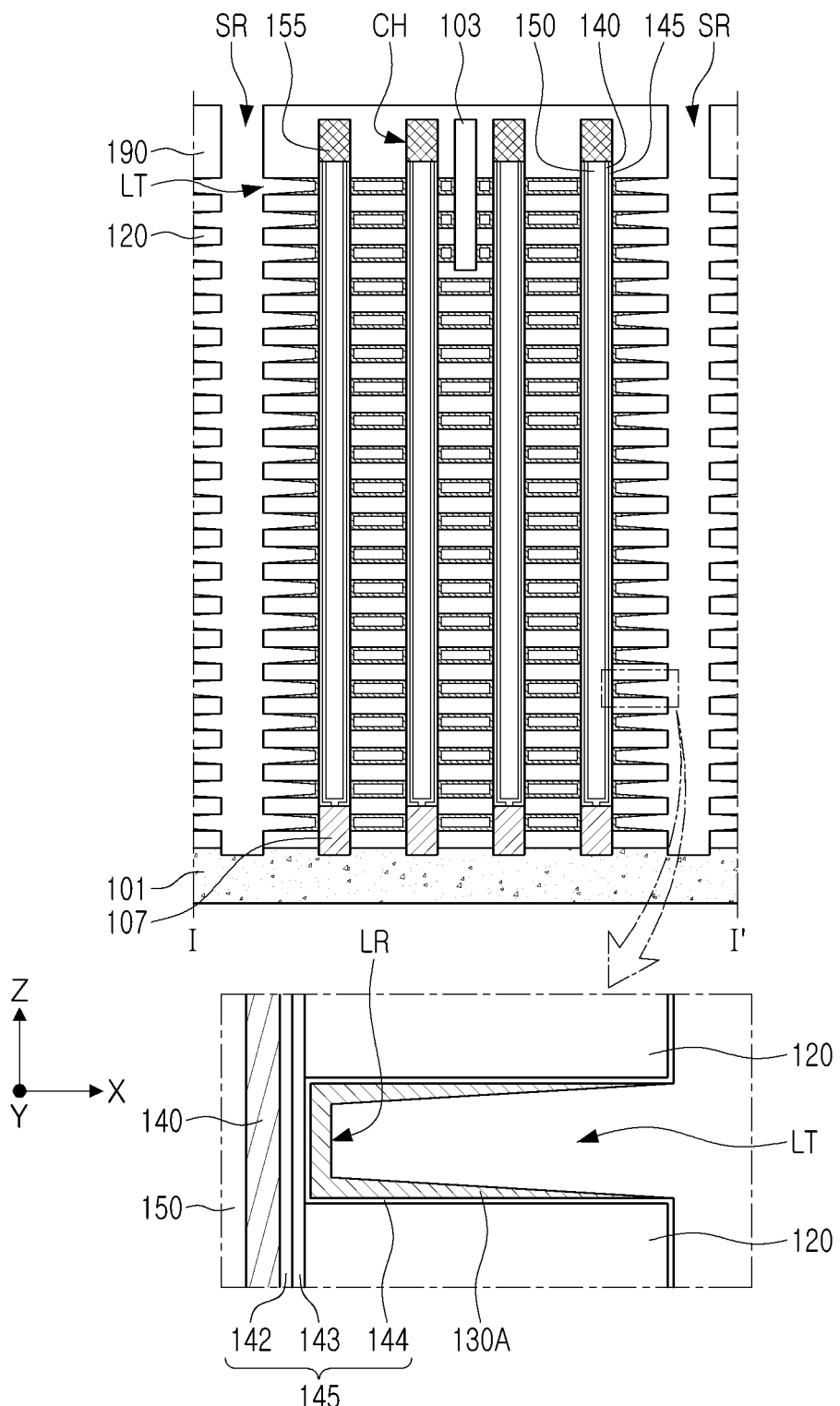

Referring to FIGS. 10 and 11F, a portion of the preliminary first conductive layer 130AP may be removed to have a thickness decreased in a direction toward the separation regions SR (S160).

The process of removing a portion of the preliminary first conductive layer 130AP may be a dry etching process using plasma or a dry etching process using no plasma. The dry etching process using plasma may use, for example, at least one radical of $NF_3$, $Cl_2$, and $F_2$. The dry etching process using no plasma may use a source gas used when the preliminary first conductive layer 130AP is deposited. For example, when the preliminary first conductive layer 130AP is formed of tungsten (W), etching may be performed using at least one source gas of $WF_6$, $WCl_6$, $WCl_5$, $W(CO)_6$, $W(C_6H_6)_2$, $W(PF_3)_6$, $W(allyl)_4$, and $(1,5\text{-COD})W(CO)_4$, $(C_5H_5)_2WH_2$. For example, etching may be performed through a chemical reaction by introducing only a source gas without a reactant gas such that the source gas for use in deposition is used as an etching gas.

During the etching process, the preliminary first conductive layer 130AP, adjacent to the separation region SR and relatively more exposed to an etchant, may be relatively more removed and the preliminary first conductive layer 130AP, spaced apart from the separation region SR and relatively less exposed to the etchant, may be relatively less removed. Accordingly, the first conductive layer 130A may have a thickness gradually increased in a direction from an external side adjacent to the separation region SR to the channel structures CH and may have a surface profile sloped on upper and lower surfaces of the interlayer insulating layers 120. The first conductive layer 130A may not be etched or rarely etched between the channel structures CH, disposed not to be adjacent to the separation region SR, to have a substantially planar upper surface, but a shape of the upper surface of the first conductive layer 130A is not limited thereto. In some embodiments, the first conductive layer 130A may have, for example, a sloped upper surface even between internal channel structures CH disposed not to be adjacent to the separation region SR.

In this process step, etching conditions may be controlled such that the interlayer insulating layers 120 are not removed while removing a portion of the preliminary first conductive layer 130AP. In some embodiments, a portion of the interlayer insulating layers 120 adjacent to the separation region SR may be removed while removing a portion of the preliminary first conductive layer 130AP. In the case of the blocking layer 144, at least a portion of the blocking layer 144 may be removed on sidewalls of the interlayer insulating layers 120 together with the preliminary first conductive layer 130AP.

Figure 11G:
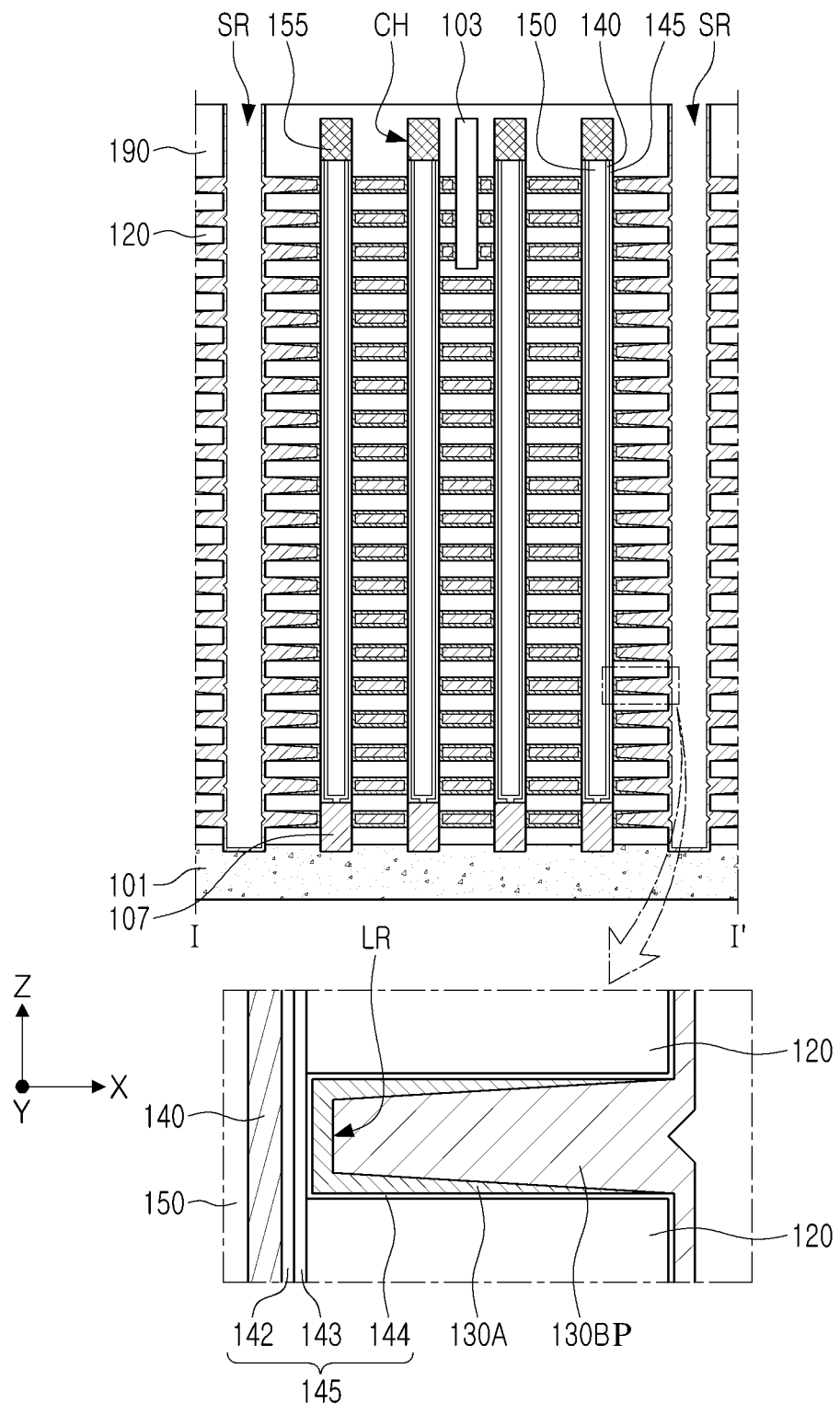

Referring to FIGS. 10 and 11G, a preliminary second conductive layer 130BP may be formed on the first conductive layer 130A to form gate electrodes 130 (S170).

The preliminary second conductive layer 130BP may be formed by, for example, a CVD or ALD process. The preliminary second conductive layer 130BP may be formed to completely fill the lateral openings LT between the interlayer insulating layers 120.

When the preliminary second conductive layer 130BP is formed of tungsten (W), at least one of $WF_6$, $WCl_6$, $WCl_5$, $W(CO)_6$, $W(C_6H_6)_2$, $W(PF_3)_6$, $W(allyl)_4$, and $(1,5-COD)W(CO)_4$, $(C_5H_5)_2WH_2$ may be used as a source gas, and deposition may be performed using at least one reactant gas of $B_2H_6$, $SiH_4$, and $H_2$. In some embodiments, the preliminary second conductive layer 130BP may include a nucleation layer and a bulk layer, or may include only a bulk layer.

Since the laterally recessed regions LR have a profile, in which an opening width is increased in a direction toward the separation region SR, depending on a shape of the first conductive layer 130A, step coverage of the preliminary second conductive layer 130BP may be increased and gap-filling capability thereof may be increased. Accordingly, in the semiconductor device, a void-free gate electrode 130 may be formed even when the number of gate electrodes 130, stacked to increase integration density, is increased and a distance between adjacent separation regions SR is increased to prevent inclination of the stacked structure during a process of forming the semiconductor device.

Figure 11H:
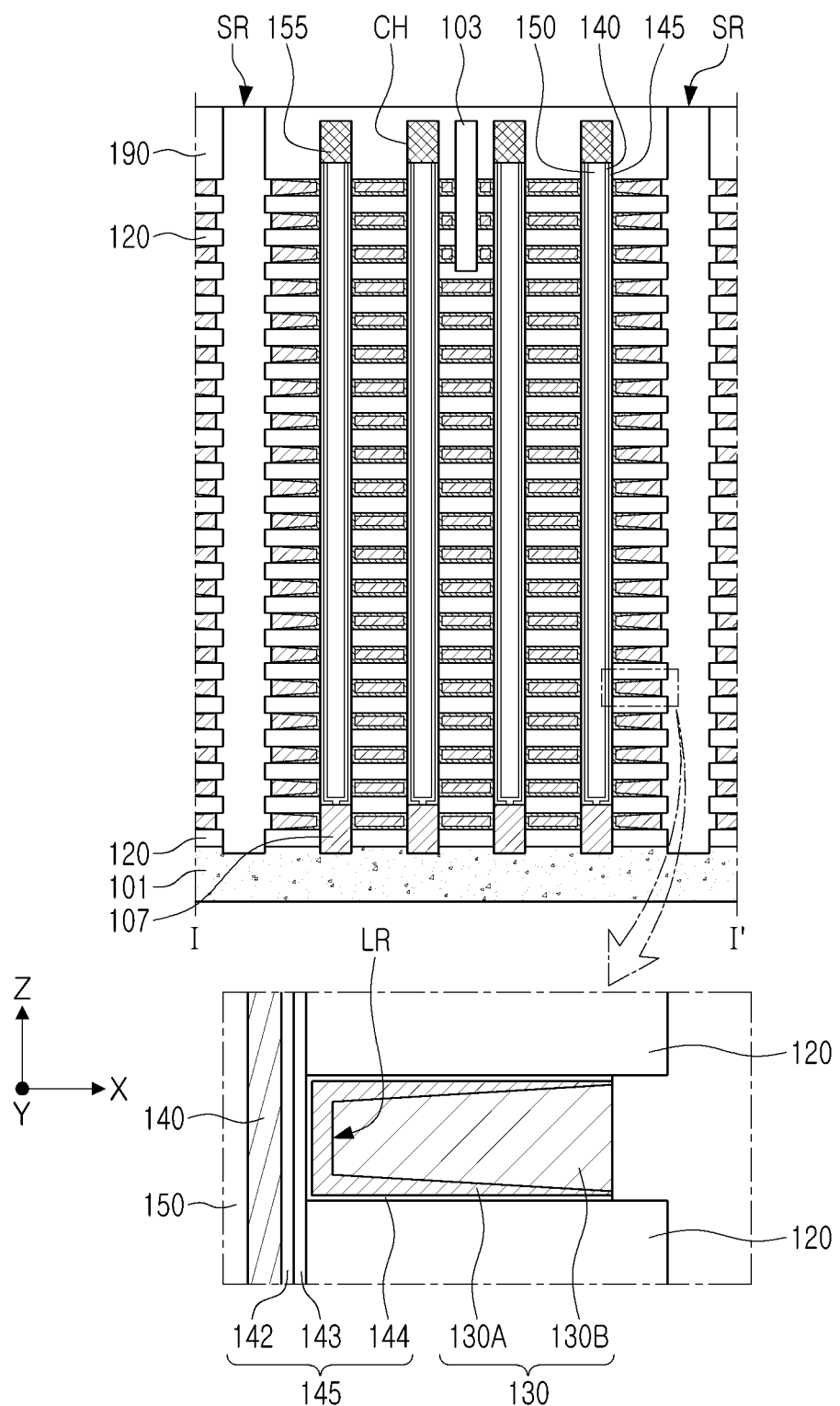

Referring to FIG. 11H, a material of the gate electrode 130 formed on the sidewalls of the interlayer insulating layers 120 and on the substrate 101 in the separation regions SR, may be removed.

The preliminary second conductive layer 130BP, formed in the separation regions SR, may be removed by an etching process such that the gate electrode 130 is disposed only in the lateral openings LT. The etching process may be, for example, a wet etching process. In the etching process, the preliminary second conductive layer 130BP may be partially removed and recessed to form the second conductive layer 130B, and the first conductive layer 130A of FIG. 11G may be partially removed with the partial removal of the preliminary second conductive layer 130BP. The gate electrode 130 may include the first conductive layer 130A partially removed and the second conductive layer 130B. As a result, side surfaces of the gate electrodes 130 may be defined. For electrical isolation between gate electrodes 130 vertically adjacent to each other, the side surfaces of the gate electrodes 130 may be further recessed inwardly toward the channel structures CH than the side surfaces of the interlayer insulating layers 120. In this process step, the blocking layer 144 formed in the separation regions SR may also be removed to form side surfaces of the blocking layer 144 at the same or similar positions as the side surfaces of the gate electrodes 130.

Figure 11I:
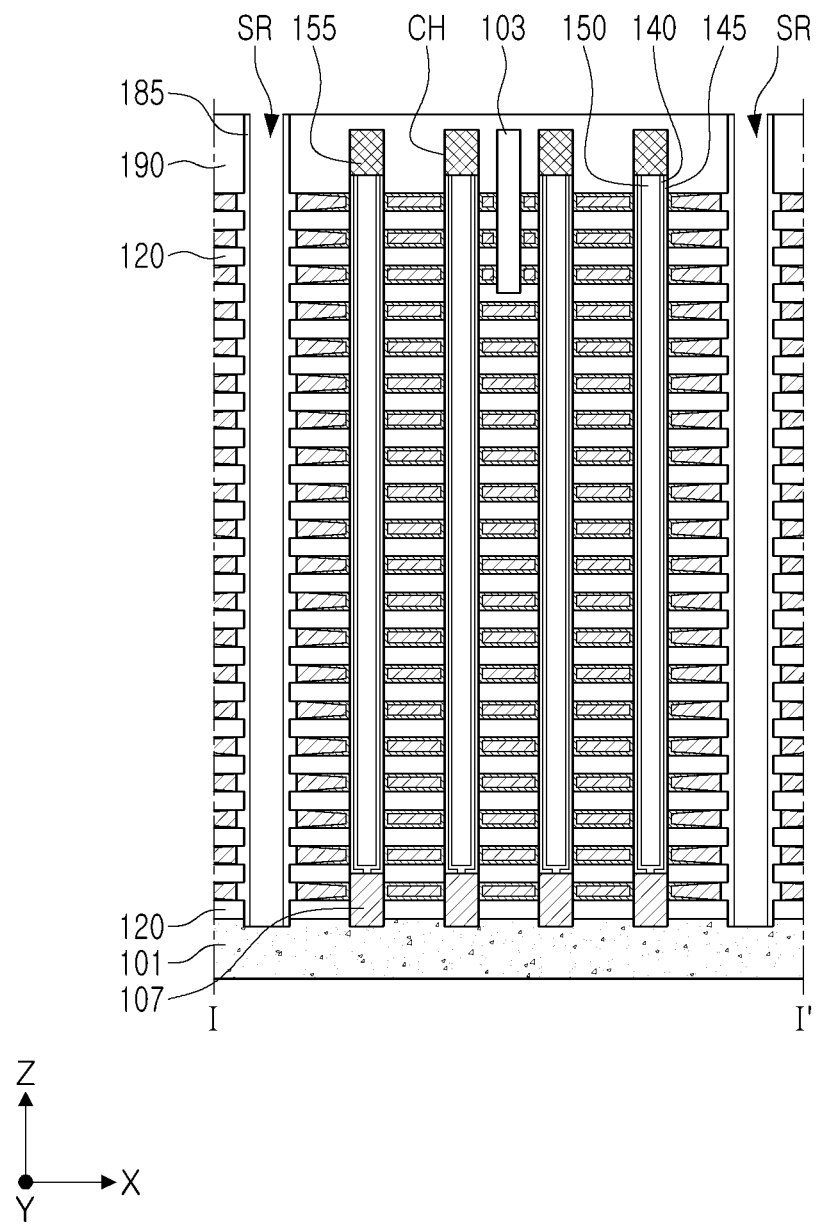

Referring to FIG. 11I, a source insulating layer 185 may be formed in the separation regions SR.

The source insulating layer 185 may be formed by forming an insulating material to cover the side surfaces of the gate electrodes 130 and the interlayer insulating layers 120 and removing the insulating material on the substrate 101 to expose the upper surface of the substrate 101.

Referring to FIG. 4, a conductive material may be deposited between source insulating layers 185 on opposite sides of the separation regions SR to form a source conductive layer 180. Then, interconnection structures such as contact plugs and bitlines may be further formed on the channel pads 155 to manufacture the semiconductor device 100.

Figure 12:
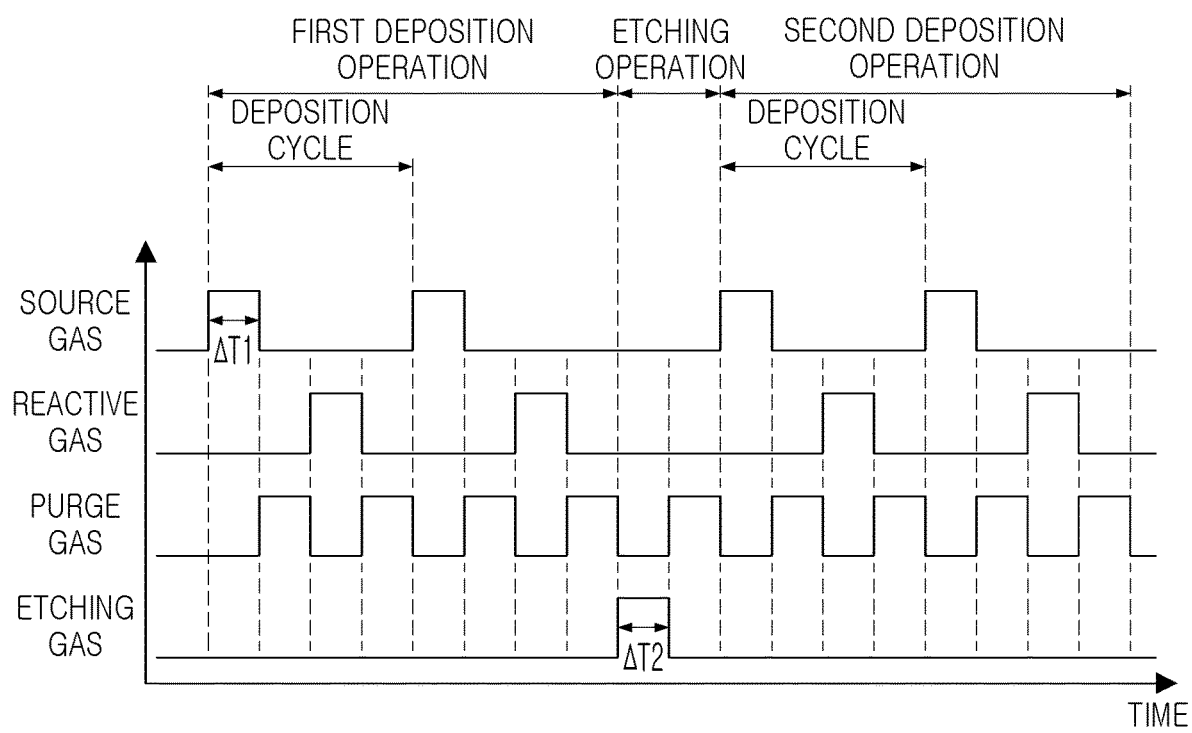
FIG. 12 is a process flow diagram illustrating a method of manufacturing a semiconductor device according to example embodiments.

FIG. 12 is a process flow diagram illustrating a method of manufacturing a semiconductor device according to example embodiments.

Referring to FIG. 12, an injection flow of process gases in the process step of forming the first conductive layer 130A and the second conductive layer 130B, described with reference to FIGS. 11E to 11G, is illustrated. A gate electrode 130 may be formed by sequentially performing a first deposition process to form a preliminary first conductive layer 130AP, an etching process to remove a portion of the preliminary first conductive layer 130AP, and a second deposition process to form the second conductive layer 130B.

In the first deposition process, a source gas and a reactant gas may be alternately supplied to form the preliminary first conductive layer 130AP. After each of the source gas and the reactant gas is supplied, a purge gas may be supplied. One deposition cycle may be repeatedly performed two or more times to form the preliminary first conductive layer 130AP.

The source gas may include a precursor containing a material forming the preliminary first conductive layer 130AP. The precursor may be supplied in a gaseous state or may be supplied with an inert gas as a carrier gas. The reactant gas may be supplied to assist nucleation of the precursor, and may be a gas for oxidizing or reducing the precursor. Argon (Ar), helium (He), or nitrogen ($N_2$) may be used as the purge gas. Remaining by-products and non-adsorbed source and reactant gases may be removed by the purge gas. For example, when the preliminary first conductive layer 130AP is formed of tungsten (W), the source gas may be one of $WF_6$, $WCl_6$, $WCl_5$, $W(CO)_6$, $W(C_6H_6)_2$, $W(PF_3)_6$, $W(allyl)_4$, and $(1,5-COD)W(CO)_4$, $(C_5H_5)_2WH_2$. The reactant gas may be at least one of $B_2H_6$, $SiH_4$, and $H_2$.

In the etching process, an etching gas may be supplied to remove a portion of the preliminary first conductive layer 130AP. After the etching gas is supplied, the purge gas may be supplied. The etching gas may be supplied for a predetermined time $\Delta T2$, which may be longer than or equal to a supply time $\Delta T1$ of the source gas in the first deposition process.

The etching gas may include a precursor containing a material forming the preliminary first conductive layer 130AP. When the preliminary first conductive layer 130AP is formed of tungsten (W), the etching gas may include at least one of $WF_6$, $WCl_6$, $WCl_5$, $W(CO)_6$, $W(C_6H_6)_2$, $W(PF_3)_6$, $W(allyl)_4$, $(1,5-COD)W(CO)_4$, and $(C_5H_5)_2WH_2$. In an example embodiment, the source gas may be $WF_6$, and the etching gas may be $WCl_6$ having relatively large etching characteristics. Alternatively, in an example embodiment, the source gas and the etching gas may be the same gas. In the etching process, one cycle may also be repeatedly performed two or more times. In this embodiment, the preliminary first conductive layer 130AP may be removed using a precursor, available as the source gas, without using plasma. Thus, a process may be simplified and may be performed using a single manufacturing apparatus.

In the second deposition process, a source gas and a reactant gas may be alternately supplied to form the second conductive layer 130B. After each of the source gas and the reactant gas is supplied, a purge gas may be supplied. One deposition cycle may be repeatedly performed two or more times to form the second conductive layer 130B. The description of the first deposition process may be identically applied to the above gases.

The first deposition process, the etching process, and the second deposition process may be performed in a single chamber or a plurality of chambers of the manufacturing apparatus, which will be described below in further detail with reference to FIGS. 13 to 14B.

Figure 13:
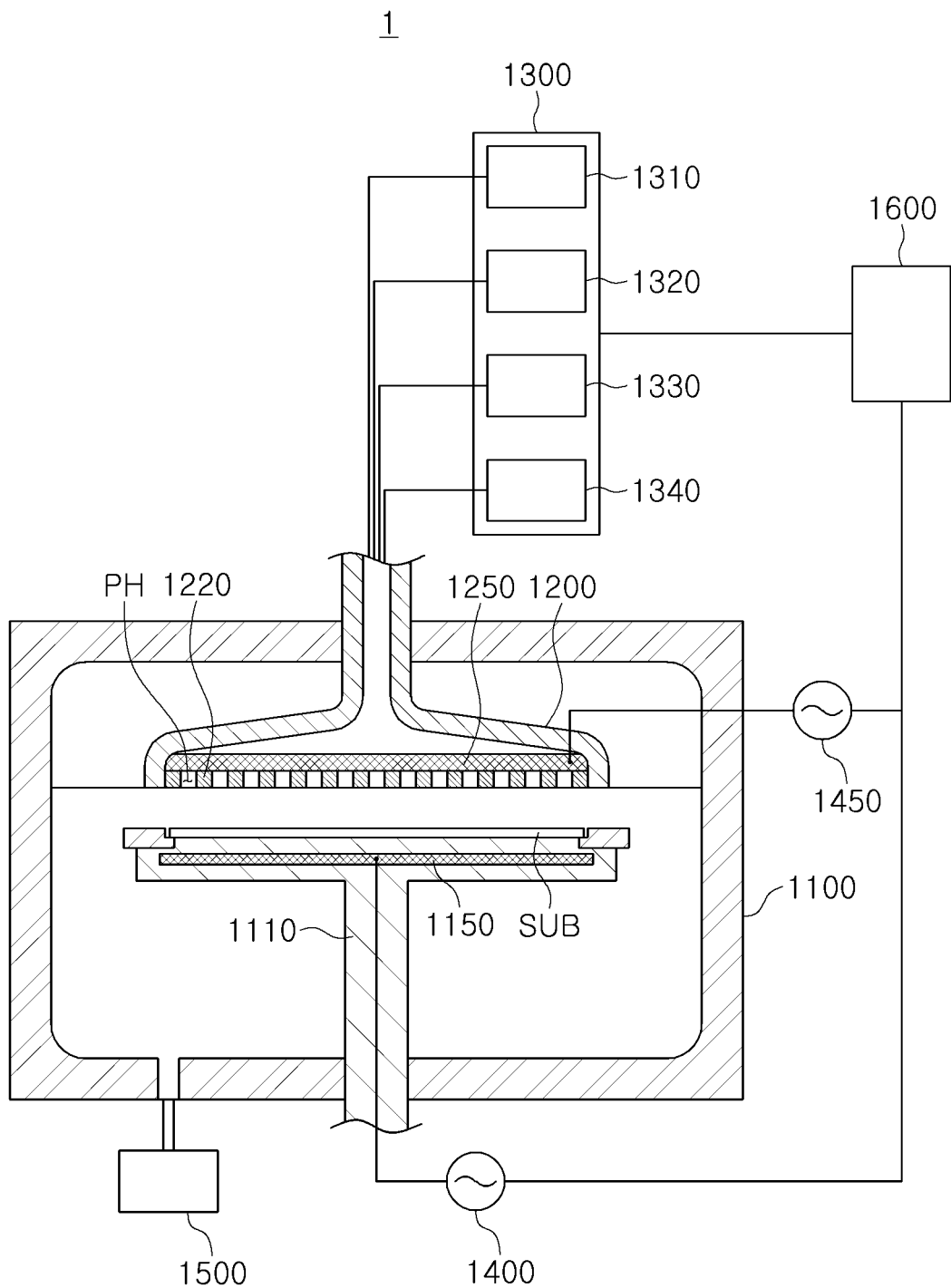
FIG. 13 is a schematic diagram of a manufacturing apparatus used to manufacture a semiconductor device according to example embodiments.

FIG. 13 is a schematic diagram of a manufacturing apparatus used to manufacture a semiconductor device according to example embodiments.

Referring to FIG. 13, an apparatus 1 for manufacturing a semiconductor device may include a process chamber 1100, a substrate support unit 1110 disposed in the process chamber 1100, and a gas injection unit 1200 disposed in the process chamber 1100, a gas supply unit 1300 connected to the gas injection unit 1200, power supply units 1400 and 1450 connected to the substrate support unit 1110 and the gas injection unit 1200 respectively, an exhaust unit 1500 connected to the inside of the process chamber 1100, and a control unit 1600.

The apparatus 1 may be an apparatus for depositing and etching a thin film on a substrate SUB and may perform not only a CVD process or an ALD process but also a dry etching process. In particular, the apparatus 1 may be used to form the gate electrode 130 of the semiconductor devices of FIGS. 1 to 9. The substrate SUB, processed by the apparatus 1, may be provided on the substrate support unit 1110.

The process chamber 1100 may provide a space in which a deposition process is performed. The process chamber 1100 may include an upper wall, a sidewall, and a lower wall. Although not illustrated, a passage, through which the substrate SUB is carried in or carried out, may be provided on one side of the process chamber 1100.

The substrate support unit 1110 may be disposed in a lower region of the process chamber 1100. The substrate support unit 1110 may include a support portion having an upper surface, on which the substrate SUB is seated, and an electrode 1150 in the support portion. The electrode 1150 may be supplied with, for example, radio-frequency (RF) power from the power supply unit 1400.

The gas injection unit 1200 may be disposed above the substrate support unit 1110 to face the substrate support unit 1110 in the process chamber 1100. The gas injection unit 1200 may be connected to the gas supply unit 1300 to distribute process gases, such as a source gas, a reactant gas, and an etching gas, supplied from the gas supply unit 1300 and to provide the distributed gases to the upper surface of the substrate SUB. The gas injection unit 1200 may be, for example, a shower head and may include a gas supply passage connected to first to fourth gas sources 1310, 1320, 1330, and 1340 of the gas supply unit 1300. In addition, the gas injection unit 1200 may include a plate 1220 having a plurality of injection holes PH for injecting a process gas. The injection holes PH may be disposed radially from a central region of the gas injection unit 1200. The gas injection unit 1200 may further include an electrode 1250 on the plate 1220, and the electrode 1250 may be supplied with, for example, RF power from the power supply unit 1450. In example embodiments, a diffusion plate may be further disposed in the gas injection unit 1200 to disperse the process gas.

The gas supply unit 1300 may include the first to fourth gas sources 1310, 1320, 1330, and 1340 and first to fourth gas sources 1310, 1320, 1330, and 1340 may be configured to supply different gases. For example, the source gas described with reference to FIG. 12 may be supplied through the first gas source 1310, and the reactant gas may be supplied through the second gas source 1320. In addition, the etching gas may be supplied through the third gas source 1330, and the purge gas may be supplied through the fourth gas source 1340. In some embodiments, the gas supply unit 1300 may include only three gas sources. For example, when an etching process is performed using the source gas used during a deposition process, in other words, when the deposition gas and the etching gas are the same, the third gas source 1330 may be omitted in the gas supply unit 1300. The gas supply unit 1300 may include a mass flow controller (MFC) configured to control a supply flow rate, a valve configured to supply a gas to the process chamber 1100 or to cut off the supplied gas, or the like, other than the first to fourth gas sources 1310, 1320, 1330, and 1340.

The power supply units 1400 and 1450 may supply RF power and may generate an electric field, by a voltage difference, in lower and upper portions of the substrate SUB. Thus, plasma may be generated in a process region in which a deposition process is performed on the substrate SUB. The gas injection unit 1200 may be connected to a ground voltage by the power supply unit 1450. The process region may correspond to a region between the substrate support unit 1110 and the gas injection unit 1200. In example embodiments, since at least a portion of the source gas may be in a plasma state, deposition on the substrate SUB may be facilitated. However, the plasma may be controlled so as not to be generated in the etching process.

The exhaust unit 1500 may be configured to discharge by-products and residual gases in the process chamber 1100 to the outside of the process chamber 100. The exhaust unit 1500 may include a vacuum pump. The materials inside the process chamber 1100 may be discharged to the outside of the process chamber 1100 by vacuum suction force generated by the vacuum pump. In example embodiments, a position, the number, and the like of the exhaust unit 1500 may be variously changed.

The controller 1600 may control gas supply order, time, flow rate, and the like of gases supplied by the gas supply unit 1300. As described above with reference to FIG. 12, the first gas source 1310 and the second gas source 1320 may be controlled to alternately supply the source gas and the reactant gas in the first and second deposition processes, and the third gas source 1330 may be controlled to supply the etching gas in the etching process. In addition, the gas supply unit 1300 may be controlled to sequentially perform the first deposition process, the etching process, and the second deposition process. As a result, the first deposition process, the etching process, and the second deposition process may be performed in-situ in the single process chamber 1100. In this case, movement of the substrate SUB between chambers may be omitted to reduce a process time and to increase productivity. In addition, the controller 1600 may also control supply of the RF power supplied by the power supply units 1400 and 1450. Although not illustrated, the controller may include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the processing controller 1020 (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the controller can include antennas, network interfaces that provide wireless and/or wire line digital and/or analog interface to one or more networks over one or more network connections (not shown), a power source that provides an appropriate alternating current (AC) or direct current (DC) to power one or more components of the controller, and a bus that allows communication among the various disclosed components of the controller.

However, configurations, structures, and dispositions of the process chamber 1100, the gas injection unit 1200, the substrate support unit 1110, the gas supply unit 1300, the power supply unit 1400, 1450 of the apparatus 1, illustrated in FIG. 13, are merely exemplary and may vary depending on example embodiments.

Figure 14A:
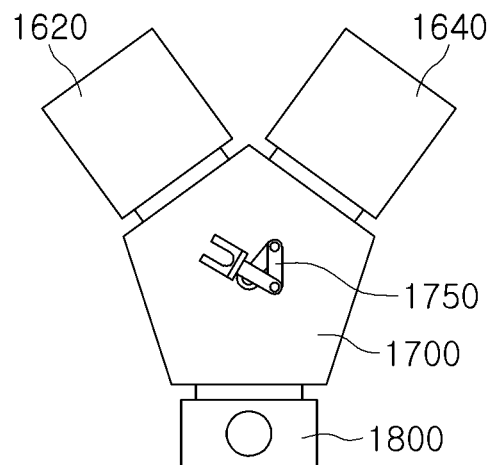
FIGS. 14A and 14B are schematic diagrams of a manufacturing apparatus used to manufacture a semiconductor device according to example embodiments.
Figure 14B:
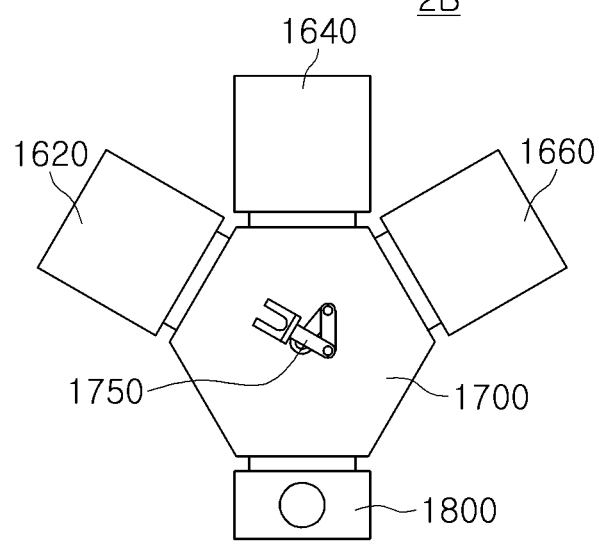

FIGS. 14A and 14B are schematic diagrams of a manufacturing apparatus used to manufacture a semiconductor device according to example embodiments.

Referring to FIG. 14A, a manufacturing apparatus 2A may include two chambers including first and second process chambers 1620 and 1640, in which different processes are performed, and may further include a rotation driver 1700 connected to the first and second process chambers 1620 and 1640, and a loadlock chamber 1800 disposed on one side of the rotation driver 1700.

The first process chamber 1620 may be a chamber for deposition, and the second process chamber 1640 may be a chamber for performing an etching process. The first deposition process to form the preliminary first conductive layer 130AP and the second deposition process to form the preliminary second conductive layer 130BP, described above with reference to FIG. 12, may be performed in the first process chamber 1620. The etching process to etch the preliminary first conductive layer 130AP and the preliminary second conductive layer 130BP, described above with reference to FIG. 12, may be performed in the second process chamber 1640. Each of the first and second process chambers 1620 and 1640 may have the same or similar structure as described above with reference to FIG. 13.

The rotation driver 1700 may be connected to the first and second process chambers 1620 and 1640. The rotation driver 1700 may drive an arm portion 1750 to elevate the substrate SUB (see FIG. 13), and may rotate the arm portion 1750 to move the substrate SUB between the first and second process chambers 1620 and 1640.

The loadlock chamber 1800 may be provided to protect the first and second process chambers 1620 and 1640 from an external environment, and may include a loading portion and an unloading portion. For example, the loadlock chamber 1800 may allow introduction of a new wafer into the rotation driver 1700 with little breaking of vacuum therein.

Referring to FIG. 14B, a manufacturing apparatus 2B may include three process chambers including first to third process chambers 1620, 1640, and 1660, in which different processes are performed, and may further include a rotation driver 1700 connected to the process chambers 1620, 1640, and 1660, and a loadlock chamber 1800 disposed on one side of the rotation driver 1700.

The first and third process chambers 1620 and 1660 may be a chamber for deposition, and the second process chamber 1640 may be a chamber for performing an etching process. The first deposition process to form the preliminary first conductive layer 130AP, described above with reference to FIG. 12, may be performed in the first process chamber 1620, and the etching process to etch the preliminary first conductive layer 130AP, described above with reference to FIG. 12, may be performed in the second process chamber 1640. The second deposition process to form the preliminary second conductive layer 130BP, described above with reference to FIG. 12, may be performed in the third process chamber 1660. Each of the first and third process chambers 1620, 1640, and 1660 may have the same or similar structure as described above with reference to FIG. 13.

When the semiconductor devices, described above with reference to FIGS. 1 to 9, are manufactured using a system in-situ apparatus such as the manufacturing apparatuses 2A and 2B of FIGS. 14A and 14B, the first deposition process to form the preliminary first conductive layer 130AP, the etching process to etch the preliminary first conductive layer 130AP, and the second deposition process to form the preliminary second conductive layer 130BP, described above with reference to FIG. 12, may be performed in the same apparatus and at least portions of the processes may be performed in different process chambers 1620, 1640, and 1660. In this case, a chamber, in which the deposition process is performed, and a chamber, in which the etching process is performed, may be separated to be advantageous for process control such as each etching rate control thereof.

As described above, gate electrodes may be formed to include first and second conductive layers having an interface, a sloped surface, in an edge region. Thus, a semiconductor device having increased reliability may be provided. In addition, an apparatus for efficiently manufacturing such a semiconductor device may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
   a plurality of gate electrodes and a plurality of interlayer insulating layers that are alternately stacked on a substrate;
   a plurality of channel structures spaced apart from each other in a first direction and extending vertically through the plurality of gate electrodes and the plurality of interlayer insulating layers to the substrate; and
   a first separation region extending vertically through the plurality of gate electrodes and the plurality of interlayer insulating layers,
   wherein each of the plurality of gate electrodes includes a first conductive layer and a second conductive layer, the first conductive layer disposed between the second conductive layer and each of two adjacent interlayer insulating layers of the plurality of interlayer insulating layers, and in a first region, between an outermost one of the plurality of channel structures and the first separation region, of each of the plurality of gate electrodes, the first conductive layer has a decreasing thickness toward the first separation region and the second conductive layer has an increasing thickness toward the first separation region, and wherein the first conductive layer includes a first nucleation layer on each of the two adjacent interlayer insulating layers and a first bulk layer stacked on the first nucleation layer.

2. The semiconductor device of claim 1,
wherein an interface between the first conductive layer and the second conductive layer is sloped with respect to the first direction in the first region.

3. The semiconductor device of claim 2,
wherein the interface between the first conductive layer and the second conductive layer is substantially parallel to the first direction in a second region, between two adjacent channel structures of the plurality of channel structures, of each of the plurality of gate electrodes.

4. The semiconductor device of claim 1,
wherein in the first region, the first conductive layer is further disposed between the second conductive layer and a sidewall of each of the plurality of channel structures.

5. The semiconductor device of claim 1,
wherein the second conductive layer includes a second nucleation layer that is in contact with the first conductive layer and a second bulk layer stacked on the second nucleation layer.

6. The semiconductor device of claim 5,
wherein each of the first and second nucleation layers has an amorphous structure, and each of the first and second bulk layers has a crystalline structure.

7. The semiconductor device of claim 1, further comprising:
a gate dielectric layer disposed between the channel structures and the gate electrodes,
wherein the gate dielectric layer extends between the interlayer insulating layers and the first conductive layer.

8. The semiconductor device of claim 7,
wherein the second conductive layer is in contact with the gate dielectric layer in a region adjacent to an edge portion of the first conductive layer.

9. The semiconductor device of claim 1,
wherein the first conductive layer of the first region has a thickness ranging from about 0.1 nm to about 3 nm, and the second conductive layer of the first region has a thickness ranging from about 10 nm to about 30 nm.

10. The semiconductor device of claim 1,
wherein the first separation region includes a source conductive layer connected to the substrate, and a source insulating layer disposed between the source conductive layer and each of the plurality of gate electrodes.

11. The semiconductor device of claim 10,
wherein the source insulating layer includes a plurality of protrusions each of which is disposed between two insulating layers of the plurality of interlayer insulating layers.

12. The semiconductor device of claim 1, further comprising:
a second separation region spaced apart from the first separation region in the first direction,
wherein shapes of the first and second conductive layers are substantially symmetrical between the first and second separation regions in the first direction.

13. A semiconductor device comprising:
a plurality of gate electrodes stacked vertically to be spaced apart from each other on a substrate;
a plurality of channel structures extending vertically through the plurality of gate electrodes to the substrate; and
a separation region extending through the plurality of gate electrodes,
wherein each of the plurality of gate electrodes includes a first conductive layer with a laterally recessed region adjacent to an outermost channel structure of the plurality of channel structures, and a second conductive layer disposed in the laterally recessed region, and
wherein the laterally recessed region has a first width, in a first direction perpendicular to an upper surface of the substrate, in a first region adjacent to the outermost channel structure and has a second width, greater than the first width, in the first direction, in a second region adjacent to the separation region, and
wherein the second conductive layer includes a nucleation layer that is in contact with the first conductive layer and a bulk layer stacked on the nucleation layer.

14. The semiconductor device of claim 13,
wherein an interface between the laterally recessed region of the first conductive layer and the second conductive layer disposed in the laterally recessed region is sloped, and
the laterally recessed region is disposed between the separation region and the outermost channel structure.

15. The semiconductor device of claim 13,
wherein an interface between the laterally recessed region of the first conductive layer and the second conductive layer disposed in the laterally recessed region includes a discontinuous crystalline structure.

16. A semiconductor device comprising:
a plurality of gate electrodes and a plurality of interlayer insulating layers that are alternately stacked on a substrate;
a plurality of channel structures spaced apart from each other in a first direction and extending vertically through the plurality of gate electrodes and the plurality of interlayer insulating layers to the substrate; and
a first separation region extending vertically through the plurality of gate electrodes and the plurality of interlayer insulating layers,
wherein each of the plurality of gate electrodes includes a first conductive layer and a second conductive layer, the first conductive layer disposed between the second conductive layer and each of two adjacent interlayer insulating layers of the plurality of interlayer insulating layers, and
in a first region, between an outermost one of the plurality of channel structures and the first separation region, of each of the plurality of gate electrodes, the first conductive layer has a first portion which contacts a sidewall of the outermost channel structure and vertically extends along the sidewall thereof, and a second portion connected to the first portion of the first conductive layer and extending horizontally from the first portion of the first conductive layer toward first separation region, a thickness of the second portion of the first conductive layer decreasing from where the second portion of the first conductive layer and the first portion thereof are connected to each other toward the first separation region, and a thickness of the second conductive layer increasing from where the second portion of the first conductive layer and the first portion thereof are connected to each other toward the first separation region.

17. The semiconductor device of claim 16,
wherein an interface between the first conductive layer and the second conductive layer is sloped with respect to the first direction in the first region.

18. The semiconductor device of claim 16, further comprising:
a gate dielectric layer disposed between the channel structures and the gate electrodes,
wherein the gate dielectric layer extends between the interlayer insulating layers and the first conductive layer.

19. The semiconductor device of claim 16,
wherein the first separation region includes a source conductive layer connected to the substrate, and a source insulating layer disposed between the source conductive layer and each of the plurality of gate electrodes, and
wherein the source insulating layer includes a plurality of protrusions each of which is disposed between a corresponding pair of two adjacent insulating layers of the plurality of interlayer insulating layers.

20. The semiconductor device of claim 16,
wherein the first conductive layer includes a first nucleation layer on each of the two adjacent interlayer insulating layers and a first bulk layer stacked on the first nucleation layer.

\* \* \* \* \*